(12) United States Patent
Ma et al.

(10) Patent No.: US 12,206,494 B2
(45) Date of Patent: Jan. 21, 2025

(54) CODING METHOD AND APPARATUS FOR DATA COMMUNICATION

(71) Applicant: HUAWEI TECHNOLOGIES CO., LTD., Guangdong (CN)

(72) Inventors: Huixiao Ma, Shenzhen (CN); Wai Kong Raymond Leung, Shenzhen (CN); Qinhui Huang, Shenzhen (CN); Kechao Huang, Boulogne Billancourt (FR)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/954,160

(22) Filed: Sep. 27, 2022

(65) Prior Publication Data
US 2023/0021167 A1 Jan. 19, 2023

Related U.S. Application Data

(63) Continuation of application No. PCT/CN2021/081940, filed on Mar. 20, 2021.

(30) Foreign Application Priority Data

Mar. 31, 2020 (CN) .......................... 202010245565.1
Aug. 27, 2020 (CN) .......................... 202010881014.4

(51) Int. Cl.
*H04L 1/00* (2006.01)
*H04L 1/20* (2006.01)
(52) U.S. Cl.
CPC .......... *H04L 1/0046* (2013.01); *H04L 1/0047* (2013.01); *H04L 1/201* (2013.01)
(58) Field of Classification Search
CPC ..... H04L 1/0046; H04L 1/0047; H04L 1/201; H04L 1/0041; H04L 1/0064;
(Continued)

(56) References Cited

U.S. PATENT DOCUMENTS 8,276,047 B2 9/2012 Coe
10,201,026 B1 2/2019 Humblet
(Continued)

FOREIGN PATENT DOCUMENTS

CN 101632249 A 1/2010
CN 103973313 A 8/2014
(Continued)

OTHER PUBLICATIONS

Smith et al., "Staircase Codes: FEC for 100 GB/s OTN," Journal of Lightwave Technology, Jan. 1, 2012, vol. 30, No. 1, 8 pages.
(Continued)

*Primary Examiner* — James C Kerveros
(74) *Attorney, Agent, or Firm* — Fish & Richardson P.C.

(57) ABSTRACT

A coding method and apparatus for data communication are provided, and may be applied to a plurality of scenarios such as a metro network, a backbone network, and a data center interconnection. As an example method, a first codeword is formed, where the first codeword includes n image bits and n to-be-transmitted bits. The n image bits are selected from to-be-transmitted bits in m source codewords. The m source codewords are formed before the first codeword. Both n and m are positive integers, and n>m; The n to-be-transmitted bits in the first codeword are sent. The bit in the first codeword can be protected by a plurality of codewords generated at different moments. In addition, the bit in the codeword can be protected by different quantities of codewords.

20 Claims, 21 Drawing Sheets

(58) Field of Classification Search
CPC .............. H04L 1/0066; H04L 1/0071; H03M 13/2703; H03M 13/271; H03M 13/2927; H03M 13/3746; H03M 13/1515; H03M 13/152; H03M 13/19; H03M 13/2906; H03M 13/29
USPC .......................................................... 714/752
See application file for complete search history.

(56) References Cited

U.S. PATENT DOCUMENTS

| | | | | |
|---|---|---|---|---|
| 2006/0242534 A1* | 10/2006 | Livshitz | ............... | H03M 13/116 714/758 |
| 2009/0228757 A1* | 9/2009 | Nishi | .................... | H04L 1/0066 714/752 |
| 2009/0319858 A1* | 12/2009 | Sharon | .............. | H03M 13/6505 714/752 |
| 2010/0122149 A1 | 5/2010 | Coe | | |
| 2012/0300873 A1 | 11/2012 | Graumann et al. | | |
| 2014/0258815 A1* | 9/2014 | Jeong | .................... | H04L 1/0063 714/790 |
| 2016/0165274 A1* | 6/2016 | Moon | ................. | H04N 21/4348 725/116 |
| 2016/0248445 A1* | 8/2016 | Myung | ............. | H03M 13/3761 |
| 2018/0041332 A1 | 2/2018 | Yang et al. | | |
| 2018/0083653 A1 | 3/2018 | Khayat et al. | | |
| 2018/0199076 A1* | 7/2018 | Moon | ................. | H04L 27/2627 |
| 2019/0068322 A1 | 2/2019 | Smith et al. | | |
| 2019/0165885 A1* | 5/2019 | Murakami | .......... | H03M 13/1102 |
| 2019/0280810 A1 | 9/2019 | Mu et al. | | |

FOREIGN PATENT DOCUMENTS

| | | |
|---|---|---|
| CN | 109753377 A | 5/2019 |
| EP | 2351231 B1 | 8/2011 |
| JP | S58161120 A | 9/1983 |
| JP | 2021502767 A | 1/2021 |
| WO | 2012115056 A1 | 8/2012 |
| WO | 2016110973 A1 | 7/2016 |
| WO | 2023025321 A1 | 3/2023 |

OTHER PUBLICATIONS

Office Action in Japanese Appln. No. 2022-559489, mailed on Dec. 19, 2023, 12 pages (with English translation).
Sukmadji et al., "Zipper codes: spatially-coupled product-like codes with iterative algebraic decoding," Proceeding of 16th Candaian Workshop on Information Theory (CWIT), Jun. 2, 2019, 6 pages.
IEEE Std 802.3ba-2010, "Part 3: Carrier Sense Multiple Access with Collision Detection (CSMA/CD) Access Method and Physical Layer Specifications; Amendment 4: Media Access Control Parameters, Physical Layers and Management Parameters for 40 GB/s and 100 GB/s Operation," IEEE Computer Society, Jun. 22, 2010, 457 pages.
Nicholl et al., "Thoughts on 100Gb/s per lane AUI Objectives," Cisco Systems IEEE 802.3100GEL Study Group, Geneva, Jan. 2018, 18 pages.
Extended European Search Report in European Appln No. 21782019.0, dated Apr. 11, 2023, 15 pages.
International Search Report and Written Opinion in International Appln. No. PCT/CN2021/081940, mailed on Jun. 18, 2021, 18 pages (with English translation).

\* cited by examiner

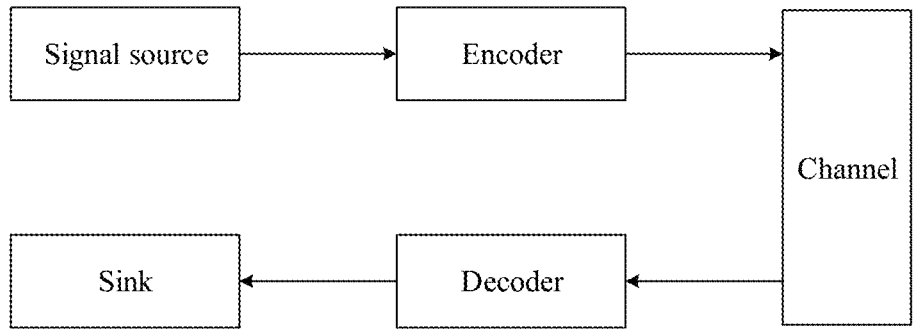
FIG. 1
Form a first code word, where the first codeword includes 2n bits and is formed by using k coding bits, n bits in the first codeword are from m codewords formed before the first codeword, the other n bits in the first codeword include (k–n) information bits and (2n–k) check bits, n, m, and k are all positive integers, and 2n>k>n>m — 201
Send the other n bits in the first codeword — 202
FIG. 2
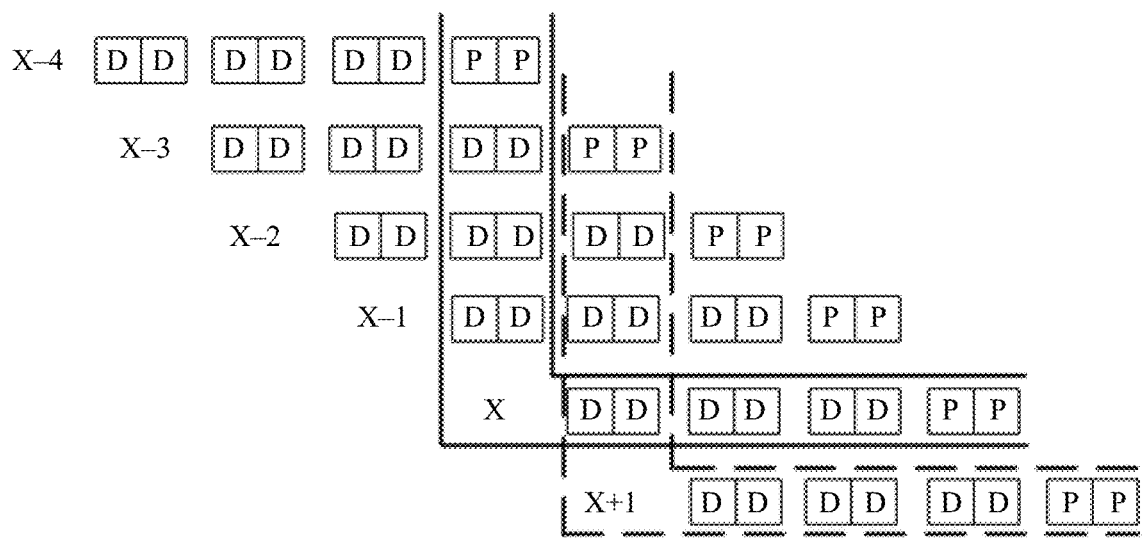
FIG. 3

FIG. 6

Recover a first codeword, where the first codeword includes 2n bits and is formed by using k coding bits, n bits in the first codeword are from m codewords decoded before the first codeword, the other n bits in the first codeword include (k–n) information bits and (2n–k) check bits, n, m, and k are all positive integers, and 2n>k>n>m — 901

Decode the first codeword to obtain a decoded bit — 902

FIG. 19

CODING METHOD AND APPARATUS FOR DATA COMMUNICATION

CROSS-REFERENCE TO RELATED APPLICATIONS

This application is a continuation of International Application No. PCT/CN2021/081940, filed on Mar. 20, 2021, which claims priority to Chinese Patent Application No. 202010245565.1, filed on Mar. 31, 2020 and Chinese Patent Application No. 202010881014.4, filed on Aug. 27, 2020. All of the aforementioned patent applications are hereby incorporated by reference in their entireties.

TECHNICAL FIELD

This application relates to a coding technology, and in particular, to a low-delay coding technology and apparatus for data communication.

BACKGROUND

In a communications system, data is usually sent at a transmit end and is transmitted to a receive end through a communications channel, to transmit a large amount of information. For example, the communications channel includes optical fiber transmission, wireless, a cable, and the like. However, when a sent signal passes through the communications channel, noise in the channel or noise of a transceiver component is superposed on the signal, which causes an error a signal received at the receive end. To recover an original signal sent by the transmit end from the error received signal, it is common to use forward error correction (Forward Error Correction, FEC).

FEC is generating a check bit of a specific length based on a coding relationship by using a to-be-transmitted information bit, then combining the check bit and the information bit for sending, and correcting, at the receive end by using the check bit and the known coding relationship, a bit error caused in a transmission process. At a current stage, as a new technology application such as artificial intelligence (Artificial Intelligence, AI) appears, a requirement for interconnecting an ultra-low delay and high reliability is increasingly prominent, and it is increasingly important to improve a coding gain and reduce a delay.

SUMMARY

This application provides a coding method and apparatus for data communication, to resolve a problem in the conventional technology that a high coding gain and a low delay cannot be ensured at the same time.

According to a first aspect, a coding method for data communication is provided. The method includes: forming a first codeword, where the first codeword includes 2n bits and is formed by using k coding bits, n bits in the first codeword are from m codewords formed before the first codeword, the other n bits in the first codeword include (k−n) information bits and (2n−k) check bits, n, m, and k are all positive integers, and $2n>k>n>m$; and sending the other n bits in the first codeword.

In this embodiment of this application, the bit in the first codeword is protected by a plurality of codewords generated at different moments, and a coding gain effect is better. In addition, codewords at different moments share different quantities of bits with each other, so that the bit in the codeword is protected by different quantities of codewords. A bit protected by a larger quantity of codewords has a higher convergence speed, so that a decoding speed of a decoder can be improved, thereby reducing a delay.

With reference to the first aspect, in a first possible implementation of the first aspect, the method further includes: storing the other n bits for use when a codeword after the first codeword is coded.

With reference to the first aspect or the first possible implementation of the first aspect, in a second possible implementation of the first aspect, a same quantity of bits in the first codeword are from all of the m codewords formed before the first codeword, where n is an integer multiple of m. In this implementation, the first codeword shares a same quantity of bits with all of the m previously formed codewords, and more than 1 bit is shared. If a large quantity of bits are shared between two codewords, a quantity of codewords that need to share a bit decreases, so that a data collection and decoding process can be quickly completed at a receive end, thereby reducing a delay.

With reference to the first aspect or the first possible implementation of the first aspect, in a third possible implementation of the first aspect, a quantity of bits in the first codeword that are from a second codeword is a, and a quantity of bits provided to the first codeword by at least one of the m codewords formed before the first codeword is different from a, where a is a positive integer, and the second codeword is any of the m codewords formed before the first codeword.

In this embodiment, codewords at different moments share different quantities of bits with each other, so that the bit in the codeword is protected by different quantities of codewords. A bit protected by a larger quantity of codewords is converged relatively fast, and then convergence of a bit protected by a smaller quantity of codewords is driven, thereby improving a decoding speed of a decoder and reducing a delay.

With reference to any one of the first aspect or the possible implementations, in a fourth possible implementation of the first aspect, the forming a first codeword specifically includes: coding n bits from the m codewords formed before the first codeword and the (k−n) to-be-transmitted information bits, to obtain the (2n−k) check bits, to form the first codeword.

With reference to any one of the first aspect or the possible implementations, in a fifth possible implementation of the first aspect, the n bits sent from the first codeword are shared with some codewords formed after the first codeword. Further, the n bits sent from the first codeword are shared with m codewords formed after the first codeword. One half of bits in each codeword are shared with a previously formed codeword, and the other half of bits are shared with a subsequently formed codeword, to ensure that each bit is protected by different codewords, thereby obtaining a better coding gain.

With reference to any one of the first aspect or the possible implementations, in a sixth possible implementation of the first aspect, each bit in the first codeword is used by at least two codewords.

With reference to any one of the first aspect or the possible implementations, in a seventh possible implementation of the first aspect, at least some of the bits in the first codeword that are from the m previously formed codewords are check bits in the previous codewords.

With reference to any one of the first aspect or the possible implementations, in an eighth possible implementation of the first aspect, n is 360, and k is 700. It should be understood that this is a specific codeword given in this application, and the first codeword may have another quantity of bits. This is not limited in this application.

With reference to any one of the first aspect or the possible implementations, in a ninth possible implementation of the first aspect, the m codewords formed before the first codeword are divided into b groups, and the n bits in the first codeword that are shared with the previous codewords are divided into b groups, and each group in the first codeword corresponds to a group in the m codewords formed before the first codeword, where b is a positive integer, and n and m each are an integer multiple of b.

With reference to the ninth possible implementation of the first aspect, in a tenth possible implementation of the first aspect, n is 360, and m is 256. The 256 codewords formed before the first codeword are divided into four groups, and each group has 64 codewords. The 360 bits in the first codeword that are shared with the previous codewords are divided into four groups, and each group has 90 bits. Each group of 90 bits is from a corresponding group of 64 codewords.

According to a second aspect, a coding apparatus for data communication is provided, where the coding apparatus includes a coding unit and a sending unit. The coding unit is configured to: form a first codeword, where the first codeword includes 2n bits and is formed by using k coding bits, n bits in the first codeword are from m codewords formed before the first codeword, the other n bits in the first codeword include (k−n) information bits and (2n−k) check bits; and send the other n bits to the sending unit, where n, m, and k are all positive integers, and 2n>k>n>m. The sending unit is further configured to send the other n bits in the first codeword.

According to the coding apparatus provided in this embodiment of this application, the bit in the first codeword is protected by a plurality of codewords generated at different moments, and a coding gain effect is better. In addition, codewords at different moments share different quantities of bits with each other, so that the bit in the codeword is protected by different quantities of codewords. A bit protected by a larger quantity of codewords has a higher convergence speed, so that a decoding speed of a decoder can be improved, thereby reducing a delay.

With reference to the second aspect, in a first possible implementation of the second aspect, the coding apparatus further includes a storage unit, configured to store the other n bits in the first codeword for use when the coding unit codes a codeword after the first codeword.

With reference to the second aspect or the first possible implementation of the second aspect, in a second possible implementation of the second aspect, a same quantity of bits in the first codeword are from all of the m codewords formed before the first codeword, where n is an integer multiple of m. In this implementation, the first codeword shares a same quantity of bits with all of the m previously formed codewords, and more than 1 bit is shared. If a large quantity of bits are shared between two codewords, a quantity of codewords that need to share a bit decreases, so that a data collection and decoding process can be quickly completed at a receive end, thereby reducing a delay.

With reference to the second aspect or the first possible implementation of the second aspect, in a third possible implementation of the second aspect, a quantity of bits in the first codeword that are from a second codeword is a, and a quantity of bits provided to the first codeword by at least one of the m codewords formed before the first codeword is different from a, where a is a positive integer, and the second codeword is any of the m codewords formed before the first codeword. In this embodiment, codewords at different moments share different quantities of bits with each other, so that the bit in the codeword is protected by different quantities of codewords. A bit protected by a larger quantity of codewords is converged relatively fast, and then convergence of a bit protected by a smaller quantity of codewords is driven, thereby improving a decoding speed of a decoder and reducing a delay.

With reference to any one of the second aspect or the possible implementations, in a fourth possible implementation of the second aspect, the coding apparatus is specifically configured to code the n bits from the m codewords formed before the first codeword and the (k−n) to-be-transmitted information bits, to obtain the (2n−k) check bits, to form the first codeword.

With reference to any one of the second aspect or the possible implementations, in a fifth possible implementation of the second aspect, the n bits sent from the first codeword are shared with some codewords formed after the first codeword. Further, the n bits sent from the first codeword are shared with m codewords formed after the first codeword. One half of bits in each codeword are shared with a previously formed codeword, and the other half of bits are shared with a subsequently formed codeword, to ensure that each bit is protected by different codewords, thereby obtaining a better coding gain.

With reference to any one of the second aspect or the possible implementations, in a sixth possible implementation of the second aspect, each bit in the first codeword is used by at least two codewords.

With reference to any one of the second aspect or the possible implementations, in a seventh possible implementation of the first aspect, at least some of the bits in the first codeword that are from the m previously formed codewords are check bits in the previous codewords.

With reference to any one of the second aspect or the possible implementations, in an eighth possible implementation of the second aspect, n is 360, and k is 700. It should be understood that this is a specific codeword given in this application, and the first codeword may have another quantity of bits. This is not limited in this application.

With reference to any one of the second aspect or the possible implementations, in a ninth possible implementation of the second aspect, the m codewords formed before the first codeword are divided into b groups, and the n bits in the first codeword that are shared with the previous codewords are divided into b groups, and each group in the first codeword corresponds to a group in the m codewords formed before the first codeword, where b is a positive integer, and n and m each are an integer multiple of b.

With reference to the ninth possible implementation of the second aspect, in a tenth possible implementation of the second aspect, n is 360, and m is 256. The 256 codewords formed before the first codeword are divided into four groups, and each group has 64 codewords. The 360 bits in the first codeword that are shared with the previous codewords are divided into four groups, and each group has 90 bits. Each group of 90 bits is from a corresponding group of 64 codewords.

According to a third aspect, a decoding method for data communication is provided. The method includes: recovering a first codeword, where the first codeword includes 2n bits and is formed by using k coding bits, n bits in the first codeword are from m codewords decoded before the first codeword, the other n bits in the first codeword include (k−n) information bits and (2n−k) check bits, n, m, and k are all positive integers, and 2n>k>n>m; decoding the first codeword to obtain a decoded bit.

It should be understood that in this embodiment, at least m codewords are decoded before the first codeword is recovered. Half of the bits in the first codeword are from the m previously decoded codewords, and the other n bits are a bit stream received at a current moment. In addition, in this embodiment, different codewords share different quantities of bits with each other, and a plurality of codewords may share more than 1 bit. A larger quantity of shared bits indicates a decrease in a quantity of codewords that need to be associated, so that decoding can be performed without waiting for a long time, thereby reducing a system delay.

With reference to the third aspect, in a first possible implementation of the third aspect, a same quantity of bits in the first codeword are from all of the m codewords decoded before the first codeword, where n is an integer multiple of m. In this implementation, the first codeword shares a same quantity of bits with all of the m previously decoded codewords, and more than 1 bit is shared. If a large quantity of bits are shared between two codewords, a quantity of codewords that need to share a bit decreases, so that a data collection and decoding process can be quickly completed, thereby reducing a delay.

With reference to the third aspect, in a second possible implementation of the third aspect, a quantity of bits in the first codeword that are from a second codeword is a, and a quantity of bits provided to the first codeword by at least one of the m codewords decoded before the first codeword is different from a, where a is a positive integer, and the second codeword is any of the m codewords decoded before the first codeword. In this embodiment, codewords at different moments share different quantities of bits with each other, so that the bit in the codeword is protected by different quantities of codewords. A bit protected by a larger quantity of codewords is converged relatively fast, and then convergence of a bit protected by a smaller quantity of codewords is driven, thereby improving a decoding speed of a decoder and reducing a delay.

With reference to any one of the third aspect or the possible implementations, in a third possible implementation of the third aspect, n is 360, and k is 700. It should be understood that this is a specific codeword given in this application, and the first codeword may have another quantity of bits. This is not limited in this application.

According to a fourth aspect, a decoding apparatus for data communication is provided, including a decoding unit and a storage unit. The decoding unit is configured to: receive a transmitted codeword, recover a first codeword, and decode the first codeword, where the first codeword includes 2n bits, n bits in the first codeword are from m codewords decoded before the first codeword, both n and m are positive integers, and n>m. The storage unit is configured to: store the transmitted codeword, receive decoding information from the decoding unit, update the stored codeword, and send an updated codeword back to the decoding unit in a subsequent decoding process. In this embodiment, in a decoding process, an information bit obtained in previous decoding is used, and the information bit is protected by different codewords, so that decoding performance is better. In addition, a larger quantity of bits shared between two codewords indicates a decrease in a quantity of codewords that need to be associated, so that decoding can be performed without waiting for a long time, thereby reducing a system delay.

With reference to the fourth aspect, in a first possible implementation of the fourth aspect, a same quantity of bits in the first codeword are from all of the m codewords decoded before the first codeword, where n is an integer multiple of m. In this implementation, the first codeword shares a same quantity of bits with all of the m previously decoded codewords, and more than 1 bit is shared. If a large quantity of bits are shared between two codewords, a quantity of codewords that need to share a bit decreases, so that a data collection and decoding process can be quickly completed, thereby reducing a delay.

With reference to the fourth aspect, in a second possible implementation of the fourth aspect, a quantity of bits in the first codeword that are from a second codeword is a, and a quantity of bits provided to the first codeword by at least one of the m codewords decoded before the first codeword is different from a, where a is a positive integer, and the second codeword is any of the m codewords decoded before the first codeword. In this embodiment, codewords at different moments share different quantities of bits with each other, so that the bit in the codeword is protected by different quantities of codewords. A bit protected by a larger quantity of codewords is converged relatively fast, and then convergence of a bit protected by a smaller quantity of codewords is driven, thereby improving a decoding speed of a decoder and reducing a delay.

With reference to any one of the fourth aspect or the possible implementations, in a third possible implementation of the fourth aspect, n is 360, and k is 700. It should be understood that this is a specific codeword given in this application, and the first codeword may have another quantity of bits. This is not limited in this application.

According to a fifth aspect, a data communication-based concatenated coding method is provided. The method includes: receiving a data bit, performing KP4 coding on the data bit to obtain a KP4 codeword, interleaving the KP4 codeword to obtain an interleaved codeword, and coding the interleaved codeword based on the coding method according to any one of the first aspect or the possible implementations of the first aspect. The interleaved codeword is not decoded before the coding according to any one of the first aspect or the possible implementations of the first aspect is performed. In this embodiment, next step of concatenated coding is directly performed on the interleaved KP4 codeword without decoding the KP4 codeword, so that power consumption can be reduced.

According to a sixth aspect, a data communication-based concatenated coding apparatus is provided, where the concatenated coding apparatus includes a first coding unit, an interleaving unit, and a second coding unit. The first coding unit is configured to: receive a data bit, perform KP4 coding on the data bit, and send an obtained KP4 codeword to the interleaving unit. The interleaving unit is configured to interleave the KP4 codeword and send an interleaved codeword to the second coding unit. The second coding unit is configured to code the interleaved codeword based on the coding method according to any one of the first aspect or the possible implementations of the first aspect. The second coding unit does not decode the interleaved codeword. In this embodiment, next step of concatenated coding is directly performed on the interleaved KP4 codeword without decoding the KP4 codeword, so that power consumption can be reduced.

According to a seventh aspect, a coding method for data communication is provided. The method includes: forming a first codeword, where the first codeword includes n image bits and n to-be-transmitted bits, the n image bits are selected from to-be-transmitted bits in m source codewords, the source codeword is a codeword formed before the first codeword, both n and m are positive integers, and n>m; and sending the n to-be-transmitted bits in the first codeword.

In this embodiment of this application, the bit in the first codeword is protected by a plurality of codewords generated at different moments, and a coding gain effect is better. In addition, codewords at different moments share different quantities of bits with each other, so that the bit in the codeword is protected by different quantities of codewords. A bit protected by a larger quantity of codewords has a higher convergence speed, so that a decoding speed of a decoder can be improved, thereby reducing a delay.

With reference to the seventh aspect, in a first possible implementation of the seventh aspect, the n to-be-transmitted bits include p check bits and (n−p) information bits. The p check bits are obtained by coding the n image bits and the (n−p) information bits, where p is a positive integer less than n.

With reference to the first possible implementation of the seventh aspect, in a second possible implementation of the seventh aspect, the n image bits include an image check bit and an image information bit. The image check bit is selected from check bits in the m source codewords, and the image information bit is selected from information bits in the m source codewords.

With reference to the second possible implementation of the seventh aspect, in a third possible implementation of the seventh aspect, a quantity of image check bits is the same as a quantity of check bits.

With reference to the seventh aspect or the possible implementations of the seventh aspect, in a fourth possible implementation of the seventh aspect, a maximum value of a difference between quantities of bits provided by different source codewords in the m source codewords to the first codeword is greater than 1 bit. In this case, error correction performance may be further improved while a low delay is maintained.

With reference to the seventh aspect or the possible implementations of the seventh aspect, in a fifth possible implementation of the seventh aspect, a code length of the first codeword is not greater than 2048, and a quantity of error correction bits is not greater than 5. In this embodiment, the first codeword can still have relatively good performance while ensuring a low delay.

With reference to the seventh aspect or the possible implementations of the seventh aspect, in a sixth possible implementation of the seventh aspect, in the m source codewords, a quantity of bits provided by at least one source codeword to the first codeword is different from a quantity of bits provided by another source codeword to the first codeword; or each source codeword provides q bits to the first codeword, where q is an integer greater than 1, and n is an integer multiple of m. In this embodiment, each bit is protected by different codewords, and one codeword may provide more than 1 bit to the first codeword, so that a decoding speed is higher while a coding gain is ensured.

With reference to the seventh aspect or the possible implementations of the seventh aspect, in a seventh possible implementation of the seventh aspect, p_word first codewords constitute a first frame, and image bits in the codewords in the first frame are from to-be-transmitted bits in codewords in h second frames generated before the first frame, where both h and p_word are positive integers greater than 1.

With reference to the seventh possible implementation of the seventh aspect, in an eighth possible implementation of the seventh aspect, frame coordinates, row coordinates, and column coordinates of bits in the h second frames are obtained through calculation by using three functions: $\Phi f(\ )$ $\Phi r(\ )$, and $\Phi c(\ )$:

$$\Phi f([\text{Frame,Row\_str,Col\_str}])=\text{Frame}-1-\text{frm\_map}(\text{floor}((\text{Col\_str}+\Delta)/\text{ceiling}(n/h)));$$

$$\Phi r([\text{Frame,Row\_str,Col\_str}])=(\text{Col\_str}\otimes\text{Row\_str})\% p\_\text{word; and}$$

$$\Phi c([\text{Frame,Row\_str,Col\_str}])=n+h*((\text{Col\_str}+\Delta)\% \text{ceiling}(n/h))+(h-1-\text{floor}((\text{Col\_str}+\Delta)/\text{ceiling}(n/h))).$$

A frame coordinate Frame, a row coordinate Row_str, and a column coordinate Col_str of the image bit in the codeword in the first frame are all integers, where Frame∈(−∞, +∞), Row_str∈[0, p_word−1], Col_str∈[0, 2n−1], frm_map(i)=h−1−i, and i∈[0, h−1].

If n/h is an integer, $\Delta$=0; if Col_str/floor(n/h)<ceiling(n/h)*h−n, $\Delta$=floor(Col_str/floor(n/h)); or if Col_str/floor(n/h)≥ceiling(n/h)*h−n, $\Delta$=ceiling(n/h)*h−n.

With reference to the eighth possible implementation of the seventh aspect, in a ninth possible implementation of the seventh aspect, a set of column coordinates Col_str of image check bits in the codewords in the first frame is shown as follows:

$$\text{Col\_str\_vec}(i,:)=[i\_\text{base}(i)-\text{Range}(i)+1:i\_\text{base}(i)],$$
where $0 \le i \le h-1$.

If i<ceiling(n/h)*h−n, i_base(i)=(i+1)*ceiling(n/h)−i−2; or if i≥ceiling(n/h)*h−n, i_base(i)=(i+1)*ceiling(n/h)−ceiling(n/h)*h−n−1. Range(i)=ceiling((p−i)/h) ROR (ceiling(n/h)*h−n), where ROR is cyclic right shifting of an array.

With reference to the eighth or the ninth possible implementation of the seventh aspect, in a tenth possible implementation of the seventh aspect, the first codeword is a BCH (720, 700) code, h=5, and p_word=64. In this case, expressions of the three functions $\Phi f(\ )$, $\Phi r(\ )$, and $\Phi c(\ )$ are shown as follows:

$$\Phi f([\text{Frame,Row\_str,Col\_str}])=\text{Frame}-1-\text{frm\_map}(\text{floor}((\text{Col\_str})/72));$$

$$\Phi r([\text{Frame,Row\_str,Col\_str}])=(\text{Col\_str Row\_str})\%64; \text{ and}$$

$$\Phi c([\text{Frame,Row\_str,Col\_str}])=360+5*((\text{Col\_str})\%72)+(4-\text{floor}((\text{Col\_str})/72)),$$

where frm_map(i)=4−i, i∈[0, 4], and i is an integer.

With reference to the tenth possible implementation of the seventh aspect, in an eleventh possible implementation of the seventh aspect, the set of the column coordinates Col_str of the image check bits in the codewords in the first frame is shown as follows:

$$\text{Col\_str\_vec}(i,:)=\{[68,69,70,71],[140,141,142,143], [212,213,214,215],[284,285,286,287],[356,357, 358,359]\}.$$

With reference to the seventh possible implementation of the seventh aspect, in a twelfth possible implementation of the seventh aspect, frame coordinates Frame', row coordinates Row_str', and column coordinates Col_str' of bits in the h second frames are obtained by using the following formulas:

$$\text{Frame}'=\text{Frame}+1+\text{frm\_map}(\text{Col\_str} \% h);$$

$$\text{Col\_str}'=(h-1-\text{Col\_str} \% h)*\text{ceiling}(n/h)+ \text{floor}(\text{Col\_str}/h)-\Delta; \text{ and}$$

$$\text{Row\_str}'=\text{Row\_str}\otimes(\text{Col\_str}'\% p\_\text{word}).$$

A frame coordinate Frame, a row coordinate Row_str, and a column coordinate Col_str of the image bit in the codeword in the first frame are all integers, where Frame∈(-∞, +∞), Row_str∈[0, p_word-1], Col_str∈[0, 2n-1], frm_map(i)=i, i∈[0, h-1], and i is an integer.

If n/h is an integer, Δ=0; if Col_str/floor(n/h)<ceiling(n/h)*h-n, Δ=floor(Col_str/floor(n/h)); or if Col_str/floor(n/h)≥ceiling(n/h)*h-n, Δ=ceiling(n/h)*h-n.

With reference to the twelfth possible implementation of the seventh aspect, in a thirteenth possible implementation of the seventh aspect, the first codeword is a BCH (720, 700) code, h=5, and p_word=64. In this case, Frame'=Frame+1+frm_map(Col_str % 5);

Col_str'=(4-Col_str %5)*72+floor(Col_str/5); and

Row_str'=Row_str(Col_str'%64),  where frm_map(i)=i, and i∈[0,4].

With reference to any one of the possible implementations of the seventh aspect, in a fourteenth possible implementation of the seventh aspect, the method further includes: storing the n to-be-transmitted bits for use when a codeword after the first codeword is coded.

With reference to any one of the possible implementations of the seventh aspect, in a fifteenth possible implementation of the seventh aspect, the n bits sent from the first codeword are shared with some codewords formed after the first codeword.

With reference to any one of the possible implementations of the seventh aspect, in a sixteenth possible implementation of the seventh aspect, each bit in the first codeword is used by at least two codewords.

With reference to any one of the possible implementations of the seventh aspect, in a seventeenth possible implementation of the seventh aspect, the first codeword is a BCH (720, 700) code.

According to an eighth aspect, a coding apparatus is provided, where the coding apparatus includes a coding unit and a sending unit. The coding unit is configured to: form a first codeword, where the first codeword includes n image bits and n to-be-transmitted bits, the n image bits are selected from to-be-transmitted bits in m source codewords, the source codeword is a codeword formed before the first codeword, both n and m are positive integers, and n>m. The sending unit is configured to send the n to-be-transmitted bits in the first codeword.

In this embodiment of this application, the bit in the first codeword is protected by a plurality of codewords generated at different moments, and a coding gain effect is better. In addition, codewords at different moments share different quantities of bits with each other, so that the bit in the codeword is protected by different quantities of codewords. A bit protected by a larger quantity of codewords has a higher convergence speed, so that a decoding speed of a decoder can be improved, thereby reducing a delay.

With reference to the eighth aspect, in a first possible implementation of the eighth aspect, the n to-be-transmitted bits include p check bits and (n-p) information bits. The p check bits are obtained by coding the n image bits and the (n-p) information bits, where p is a positive integer less than n.

With reference to the first possible implementation of the eighth aspect, in a second possible implementation of the eighth aspect, the n image bits include an image check bit and an image information bit. The image check bit is selected from check bits in the m source codewords, and the image information bit is selected from information bits in the m source codewords.

With reference to the second possible implementation of the eighth aspect, in a third possible implementation of the eighth aspect, a quantity of image check bits is the same as a quantity of check bits.

With reference to any one of the possible implementations of the eighth aspect, in a fourth possible implementation of the eighth aspect, a maximum value of a difference between quantities of bits provided by different source codewords in the m source codewords to the first codeword is greater than 1 bit.

With reference to any one of the possible implementations of the eighth aspect, in a fifth possible implementation of the eighth aspect, a code length of the first codeword is not greater than 2048, and a quantity of error correction bits is not greater than 5.

With reference to any one of the possible implementations of the eighth aspect, in a sixth possible implementation of the eighth aspect, in the m source codewords, a quantity of bits provided by at least one source codeword to the first codeword is different from a quantity of bits provided by another source codeword to the first codeword; or each source codeword provides q bits to the first codeword, where q is an integer greater than 1, and n is an integer multiple of m.

With reference to any one of the possible implementations of the eighth aspect, in a seventh possible implementation of the eighth aspect, p_word first codewords constitute a first frame, and image bits in the codewords in the first frame are from to-be-transmitted bits in codewords in h second frames generated before the first frame, where both h and p_word are positive integers greater than 1.

With reference to the seventh possible implementation of the eighth aspect, in an eighth possible implementation of the eighth aspect, frame coordinates, row coordinates, and column coordinates of bits in the h second frames are obtained through calculation by using three functions: Φf( ) Φr( ), and Φc( ):

Φf([Frame,Row_str,Col_str])=Frame-1-frm_map
(floor((Col_str+Δ)/ceiling(n/h)));

Φr([Frame,Row_str,Col_str])=(Col_str Row_str)%
p_word; and

Φc([Frame,Row_str,Col_str])=n+h*((Col_str+Δ)%
ceiling(n/h))+(h-1-floor((Col_str+Δ)/ceiling(n/
h))).

A frame coordinate Frame, a row coordinate Row_str, and a column coordinate Col_str of the image bit in the codeword in the first frame are all integers, where Frame∈(-∞, +∞), Row_str∈[0, p_word-1], Col_str∈[0, 2n-1], frm_map(i)=h-1-i, and i∈[0, h-1]. If n/h is an integer, Δ=0; if Col_str/floor(n/h)<ceiling(n/h)*h-n, Δ=floor(Col_str/floor(n/h)); or if Col_str/floor(n/h)≥ceiling(n/h)*h-n, Δ=ceiling(n/h)*h-n.

With reference to the eighth possible implementation of the eighth aspect, in a ninth possible implementation of the eighth aspect, a set of column coordinates Col_str of image check bits in the codewords in the first frame is shown as follows:

Col_str_vec(i,:)=[i_base(i)-Range(i)+1:i_base(i)],
where 0≤i≤h-1.

If i<ceiling(n/h)*h-n, i_base(i)=(i+1)*ceiling(n/h)-i-2; or if i≥ceiling(n/h)*h-n, i_base(i)=(i+1)*ceiling(n/h)-ceiling(n/h)*h-n-1. Range(i)=ceiling((p-i)/h) ROR (ceiling(n/h)*h-n), where ROR is cyclic right shifting of an array.

With reference to the eighth or the ninth possible implementation of the eighth aspect, in a tenth possible implementation of the eighth aspect, the first codeword is a BCH (720, 700) code, h=5, and p_word=64. In this case, expressions of the three functions Φf( ), Φr( ), and Φc( ) are shown as follows:

Φf([Frame,Row_str,Col_str])=Frame−1−frm_map(floor((Col_str)/72));

Φr([Frame,Row_str,Col_str])=(Col_str⊗Row_str)%64; and

Φc([Frame,Row_str,Col_str])=360+5*((Col_str)%72)+(4-floor((Col_str)/72)), where frm_map(i)=4−i, i∈[0, 4], and i is an integer.

With reference to the tenth possible implementation of the eighth aspect, in an eleventh possible implementation of the eighth aspect, the set of the column coordinates Col_str of the image check bits in the codewords in the first frame is shown as follows:

Col_str_vec(i,:)={[68,69,70,71],[140,141,142,143],[212,213,214,215],[284,285,286,287],[356,357,358,359]}.

With reference to the seventh possible implementation of the eighth aspect, in a twelfth possible implementation of the eighth aspect, frame coordinates Frame', row coordinates Row_str', and column coordinates Col_str' of bits in the h second frames are obtained by using the following formulas:

Frame'=Frame+1+frm_map(Col_str % h);

Col_str'=(h−1−Col_str % h)*ceiling(n/h)+floor(Col_str/h)−Δ; and

Row_str'=Row_str(Col_str'% p_word).

A frame coordinate Frame, a row coordinate Row_str, and a column coordinate Col_str of the image bit in the codeword in the first frame are all integers, where Frame∈(−∞, +∞), Row_str∈[0, p_word−1], Col_str∈[0, 2n−1], frm_map(i)=i, i∈[0, h−1], and i is an integer.

If n/h is an integer, Δ=0; if Col_str/floor(n/h)<ceiling(n/h)*h−n, Δ=floor(Col_str/floor(n/h)); or if Col_str/floor(n/h)≥ceiling(n/h)*h−n, Δ=ceiling(n/h)*h−n.

With reference to the twelfth possible implementation of the eighth aspect, in a thirteenth possible implementation of the eighth aspect, the first codeword is a BCH (720, 700) code, h=5, and p_word=64. In this case, Frame'=Frame+1+frm_map(Col_str % 5);

Col_str'=(4−Col_str %5)*72+floor(Col_str/5); and

Row_str'=Row_str(Col_str'%64), where frm_map(i)=i, and i∈[0,4].

With reference to any one of the possible implementations of the eighth aspect, in a fourteenth possible implementation of the eighth aspect, the method further includes: storing the n to-be-transmitted bits for use when a codeword after the first codeword is coded.

With reference to any one of the possible implementations of the eighth aspect, in a fifteenth possible implementation of the eighth aspect, the n bits sent from the first codeword are shared with some codewords formed after the first codeword.

With reference to any one of the possible implementations of the eighth aspect, in a sixteenth possible implementation of the eighth aspect, each bit in the first codeword is used by at least two codewords.

With reference to any one of the possible implementations of the eighth aspect, in a seventeenth possible implementation of the eighth aspect, the first codeword is a BCH (720, 700) code.

According to a ninth aspect, a computer-readable storage medium is provided, where the computer-readable storage medium stores instructions. When the instructions are run on a terminal device, the terminal device is enabled to perform the method according to any one of the first aspect or the possible implementations of the first aspect, or the terminal device is enabled to perform the method according to any one of the third aspect or the possible implementations of the third aspect, or the terminal device is enabled to perform the method according to any one of the seventh aspect or the possible implementations of the seventh aspect.

According to a tenth aspect, a computer program product including instructions is provided. When the computer program product is run on a terminal device, the terminal device is enabled to perform the method according to any one of the first aspect or the possible implementations of the first aspect, or the terminal device is enabled to perform the method according to any one of the third aspect or the possible implementations of the third aspect, or the terminal device is enabled to perform the method according to any one of the seventh aspect or the possible implementations of the seventh aspect. It should be understood that the terminal device may be a chip, a processor, or the like. This is not limited in this application.

According to an eleventh aspect, a data communication-based concatenated coding method is provided. The method includes: receiving a data bit; performing KP4 coding on the data bit to obtain a KP4 codeword; interleaving the KP4 codeword to obtain an interleaved codeword; and coding the interleaved codeword based on the coding method according to any one of the seventh aspect or the possible implementations of the seventh aspect, where the interleaved codeword is not decoded before the coding according to any one of the seventh aspect or the possible implementations of the seventh aspect is performed. In this embodiment, next step of concatenated coding is directly performed on the interleaved KP4 codeword without decoding the KP4 codeword, so that power consumption can be reduced.

According to a twelfth aspect, a data communication-based concatenated coding apparatus is provided, where the concatenated coding apparatus includes a first coding unit, an interleaving unit, and a second coding unit. The first coding unit is configured to: receive a data bit, perform KP4 coding on the data bit, and send an obtained KP4 codeword to the interleaving unit. The interleaving unit is configured to interleave the KP4 codeword and send an interleaved codeword to the second coding unit. The second coding unit is configured to code the interleaved codeword based on the coding method according to any one of the seventh aspect or the possible implementations of the seventh aspect. The second coding unit does not decode the interleaved codeword. In this embodiment, next step of concatenated coding is directly performed on the interleaved KP4 codeword without decoding the KP4 codeword, so that power consumption can be reduced.

In the foregoing embodiments of this application, the bit in the first codeword is protected by a plurality of codewords generated at different moments, and a coding gain effect is better. In addition, codewords at different moments share different quantities of bits with each other, so that the bit in the codeword is protected by different quantities of codewords. A bit protected by a larger quantity of codewords has a higher convergence speed, so that a decoding speed of a decoder can be improved, thereby reducing a delay.

BRIEF DESCRIPTION OF DRAWINGS

FIG. 1 is a block diagram of a structure of a communications system;

FIG. 2 is a flowchart of a coding method according to this application;

FIG. 3 is a schematic diagram of a codeword sharing rule according to an embodiment of this application;

FIG. 6 is a schematic diagram of a manner of storing an FEC frame according to another embodiment of this application;

FIG. 17(*b*) is a schematic diagram of a structure of an FEC frame according to another embodiment of this application;

FIG. 19 is a schematic diagram of an interleaving solution according to another embodiment of this application;

DESCRIPTION OF EMBODIMENTS

Figure 4:
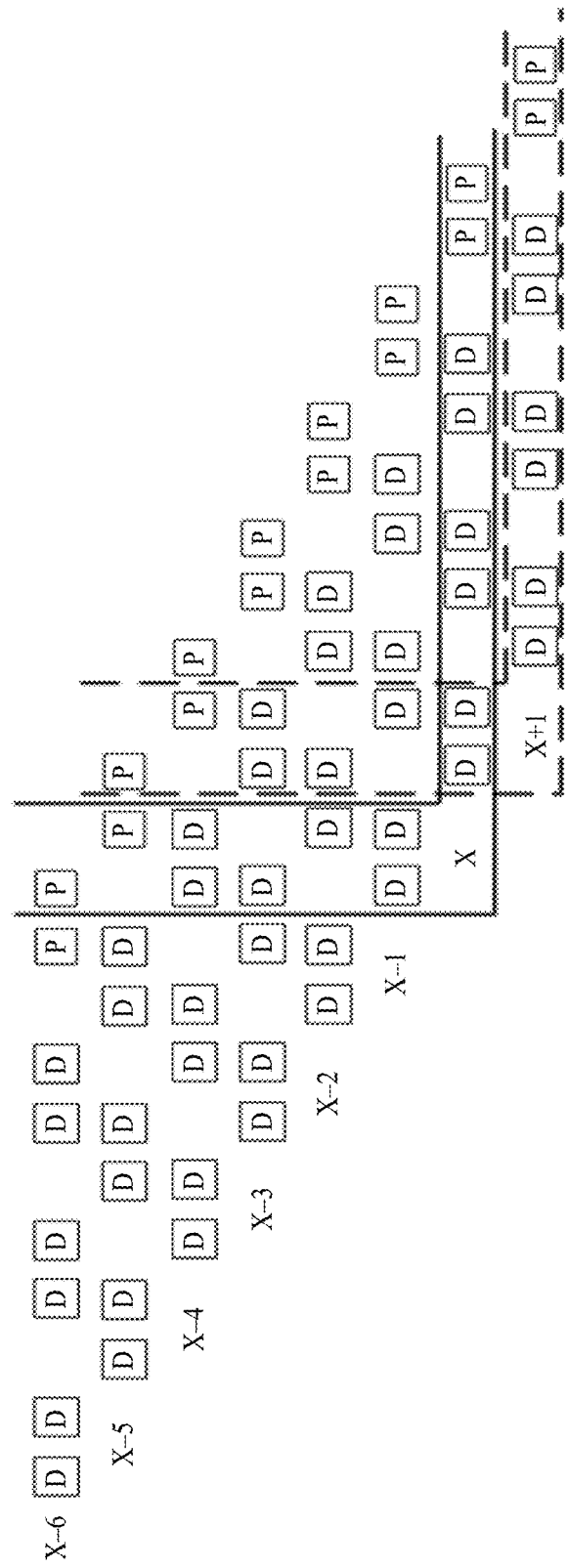
FIG. 4 is a schematic diagram of a codeword sharing rule according to another embodiment of this application.

Before the embodiments of this application are explained in detail, an application scenario of the embodiments of this application is first described. FIG. 1 is a block diagram of a structure of a communications system. At a transmit end, a source provides a to-be-sent data stream. A coder receives the data stream, codes the data stream to obtain a check bit and an information bit, and transmits codeword information obtained by combining the check bit and the information bit to a receive end through a channel. After receiving the codeword information in which an error is generated due to noise in the channel or other damage, the receive end decodes the codeword information by using a decoder to recover original data, and sends the original data to a sink. The coding method provided in this application is applied to the coder shown in FIG. 1, and is a very important part in the communications system.

After data sent from the source passes through the coder using the coding solution, a plurality of codewords including a data bit and a check bit are successively formed to constitute form a codeword stream. The generated codeword shares a bit with a previously or subsequently generated codeword, so that the bit in the codeword is protected by a plurality of codewords generated at different moments, and a better coding gain can be obtained.

This application provides a coding method for data communication. As shown in FIG. 2, the method includes the following steps.

201. Form a first codeword, where the first codeword includes 2n bits and is formed by using k coding bits, n bits in the first codeword are from m codewords formed before the first codeword, the other n bits in the first codeword include (k−n) information bits and (2n−k) check bits, n, m, and k are all positive integers, and 2n>k>n>m.

202. Send the other n bits in the first codeword.

It should be understood that in this embodiment, at least m codewords are generated before the first codeword is formed. Half of the bits in the first codeword are from the previously formed m codewords, to be specific, the half of the bits are formed by taking several bits from each of the m codewords and are shared with the previous m codewords. The remaining (k−n) bits are information bits at a current moment. The n bits shared with the previously formed m codewords and the (k−n) information bits at the current moment are coded to obtain the (2n−k) check bits, to form the first codeword. In the first codeword, n bits are sent to the previously formed codewords, and do not need to be sent again. Therefore, the other n bits in the first codeword are sent, to be specific, the remaining (k−n) information bits and the newly generated (2n−k) check bits constitute a to-be-transmitted codeword, and the to-be-transmitted codeword is sent.

Generally, the first codeword shares a bit with a previously formed codeword and a subsequently formed codeword. Each bit in the first codeword is located in at least one previously formed or subsequently formed codeword. In addition, in some embodiments, at least some of the k coding bits in the first codeword are data bits in another codeword, and at least some of the k coding bits are check bits in another codeword. In this embodiment of this application, a bit participating in codeword coding is a coding bit, and a to-be-transmitted bit received at a current moment is an information bit. In the k coding bits, n bits are shared with a previous codeword, and the remaining (k−n) bits are to-be-transmitted information bits at the current moment.

Generally, in a generated codeword stream, some initial codewords need to include padding bits, for example, an all-0 bit sequence is filled, until a sufficient quantity of codewords are formed and sufficient shared bits can be provided for a subsequent codeword. For example, as described in this embodiment of this application, the codeword includes 2n bits, and half of the bits are shared with bits in the previously formed m codewords, that is, the bit in the previous codeword is used as a coding bit in the current codeword. In this case, because m previous codewords do not exist in initial m codewords, sufficient coding bits cannot be obtained from the previous codewords. Therefore, some padding bits need to be added to the codeword to supplement a quantity of coding bits, to generate a check bit and form the first codeword. It should be understood that in the initial m codewords, a codeword other than the first codeword may share a part of bits from a previous codeword, and then the remaining part of bits are filled. Alternatively, the codeword may not share a bit with the previous codeword, and all missing coding bits are replaced with padding bits. This is not limited herein in this application.

Further, the other n bits need to be stored for use when a codeword after the first codeword is coded.

In this embodiment of this application, the n bits in the first codeword are shared with the m codewords formed before the first codeword. In addition, because n is greater than m, there is always a codeword in the m codewords that shares a plurality of bits with the first codeword. There are a plurality of specific sharing rules, which are described below.

(1) n is an integer multiple of m, and all of the m codewords share a same quantity of bits with the first codeword. FIG. 3 is a schematic diagram of a specific codeword sharing rule according to this solution. In FIG. 3, a length of each codeword is 16 bits, including 14 coding bits (D in the figure) and 2 check bits (P in the figure). In the 14 coding bits, 8 bits (half of the length of the codeword) are from four previously formed codewords, where 2 bits are taken from each codeword. For example, a codeword surrounded by a solid line in FIG. 3 is a codeword X, where 2 bits are from a codeword (X−1), 2 bits are from a codeword (X−2), and 2 bits are from a codeword (X−3). All the 6 bits are information bits in the previous codewords. Other 2 bits are from a codeword (X−4), and the 2 bits are check bits in the previous codeword. Remaining six information bits in the codeword X are to-be-transmitted information bits at a current moment. The 8 bits from the previous codewords and the 6 bits at the current moment are coded to obtain two check bits, to constitute the codeword X with a length of 16 bits.

Likewise, a next codeword (X+1) of the codeword X is shown by a part surrounded by a dotted line in FIG. 3. The codeword (X+1) includes 16 bits, where 2 bits are from the codeword X, 2 bits are from the codeword (X−1), and 2 bits are from the codeword (X−2). The 6 bits are also information bits in the previous codewords. Remaining 2 bits are from the codeword (X−3) and are check bits in the previous codeword, and remaining 6 bits are to-be-transmitted information bits at a current moment. The 8 bits from the previous codewords and the 6 bits at the current moment are coded to obtain two check bits, to constitute the codeword (X+1) with a length of 16 bits.

In the codeword stream disclosed in this embodiment, except initial 4 bits and end 4 bits (m=4), half of bits in each of intermediate codewords are shared with a previous codeword, and half of bits are shared with a subsequent codeword, so that the bit in the codeword is protected by a plurality of codewords generated at different moments, and a better coding gain can be obtained. In addition, a quantity of bits shared by each codeword with another codeword is 2, and an increase in a quantity of bits shared between two codewords indicates a decrease in a quantity of codewords that need to share a bit, so that a data collection and decoding process can be quickly completed at a receive end, thereby reducing a delay. Certainly, a quantity of shared bits may be further increased. This is not limited in this application.

(2) In the m previously formed codewords, a quantity of bits shared by at least one codeword with the first codeword is different from a quantity of bits shared by another codeword with the first codeword. For example, it is assumed that n=9 and m=4. One codeword shares 3 bits with the first codeword, and the remaining three codewords each share 2 bits with the first codeword; or one codeword shares 1 bit with the first codeword, another codeword shares 2 bits with the first codeword, and the remaining two codewords each share 3 bits with the first codeword.

FIG. 4 is a schematic diagram of a specific codeword sharing rule according to this solution. In FIG. 4, a length of each codeword is also 16 bits, including 14 coding bits (D in the figure) and 2 check bits (P in the figure). In the 14 coding bits, 8 bits (half of the length of the codeword) are from six previously formed codewords. A quantity of bits obtained from each codeword is shown in FIG. 4. For example, a codeword surrounded by a solid line in FIG. 4 is a codeword X, where 2 bits are from a codeword (X−1), 1 bit is from a codeword (X−2), 1 bit is from a codeword (X−3), and 2 bits are from a codeword (X−4). All the 6 bits are information bits in the previous codewords. Remaining 2 bits both are check bits in the previous codewords, where 1 bit is from a codeword (X−5), and the other bit is from a codeword (X−6). Remaining 6 bits in the codeword X are to-be-transmitted information bits at a current moment. The 8 bits from the previous codewords and the 6 bits at the current moment are coded to obtain two check bits, to constitute the codeword X with a length of 16 bits. Likewise, a subsequent codeword (X+1) of the codeword X is shown by a part surrounded by a dotted line in FIG. 4, and is similar to the codeword X. Details are not described again in this application.

In addition, when n is an integer multiple of m, a quantity of bits shared by at least one codeword with the first codeword may be different from a quantity of bits shared by another codeword with the first codeword. For example, n=8 and m=4. One codeword shares 5 bits with the first codeword, and the remaining codewords each share 1 bit with the first codeword; or two codewords each share 3 bits with the first codeword, and the other two codewords each share 1 bit with the first codeword.

Figure 5:
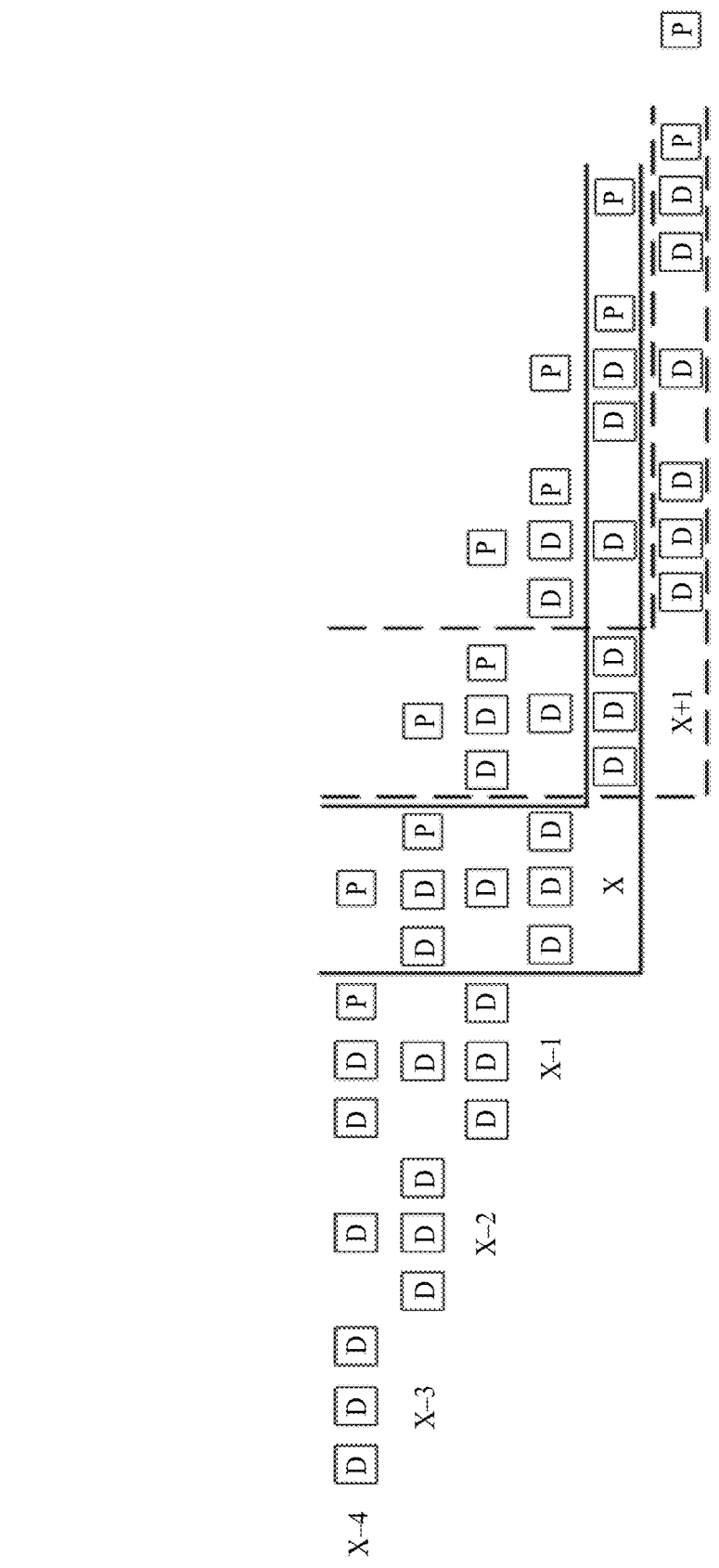
FIG. 5 is a schematic diagram of a codeword sharing rule according to another embodiment of this application.

FIG. 5 is a schematic diagram of another specific codeword sharing rule according to this solution. In FIG. 5, a length of each codeword is also 16 bits, including 14 coding bits (D in the figure) and 2 check bits (P in the figure). In the 14 coding bits, 8 bits (half of the length of the codeword) are from four previously formed codewords. A quantity of bits obtained from each codeword is shown in FIG. 5. For example, a codeword surrounded by a solid line in FIG. 4 is a codeword X, where 3 bits are from a codeword (X−1), 1 bit is from a codeword (X−2), 3 bits are from a codeword (X−3), and 1 bit is from a codeword (X−4). The 8 bits include six information bits in the previous codewords and two check bits in the previous codewords. Remaining 6 bits in the codeword X are to-be-transmitted information bits at a current moment. The 8 bits from the previous codewords and the 6 bits at the current moment are coded to obtain two check bits, to constitute the codeword X with a length of 16 bits. Likewise, a subsequent codeword (X+1) of the codeword X is shown by a part surrounded by a dotted line in FIG. 4, and is similar to the codeword X. Details are not described again in this application.

In the codeword stream disclosed in this embodiment, except initial m bits and end m bits (m=6 in FIG. 4 and m=4 in FIG. 5), half of bits in each of intermediate codewords are shared with a previous codeword, and half of bits are shared with a subsequent codeword, so that the bit in the codeword is protected by a plurality of codewords generated at different moments, and a better coding gain can be obtained. In addition, codewords at different moments share different quantities of bits with each other, so that the bit in the codeword is protected by different quantities of codewords. A bit protected by a larger quantity of codewords is converged relatively fast, and then convergence of a bit protected by a smaller quantity of codewords is driven, thereby improving a convergence speed of a decoder and reducing a delay. It should be understood that FIG. 4 and FIG. 5 only provide two different bit sharing manners, and there is another sharing manner. This is not limited in this application.

Optionally, a maximum value of a difference between quantities of bits provided by different codewords in the m previously formed codewords to the first codeword is greater than 1 bit. In this case, error correction performance may be further improved while a low delay is maintained.

It may be learned from the foregoing two different embodiments that, except initial and end codewords, half of bits in each of intermediate codewords are from a previously formed codeword. A function of the half of bits is to participate in generation of a check bit together with an information bit at a current moment, and the half of bits do not participate in transmission of the current codeword. The information bit at the current moment and the check bit generated through coding constitute the other half of bits in the codeword. The other half of bits are to-be-transmitted bits and are shared with a subsequently formed codeword.

For example, the first codeword is a Bose-Chaudhuri-Hocquenghem (Bose-Chaudhuri-Hocquenghem, BCH) code whose quantity of bits is 720, where 360 bits are from a previously formed codeword, and 340 bits are information bits in the current codeword. A total of 700 coding bits can be coded based on a generator polynomial corresponding to the BCH (720, 700), to obtain 20 check bits. The 360 bits from the previously formed codeword do not participate in data transmission, and the 340 current information bits and the 20 check bits jointly form a to-be-transmitted BCH codeword having 360 bits. It should be understood that the BCH (720, 700) is obtained by shortening a BCH (1023, 1003) by 303 bits. A specific shortening manner may be removing 303 most significant bits or removing 303 least significant bits, or may be another manner. This is not limited in this application.

Figure 6:
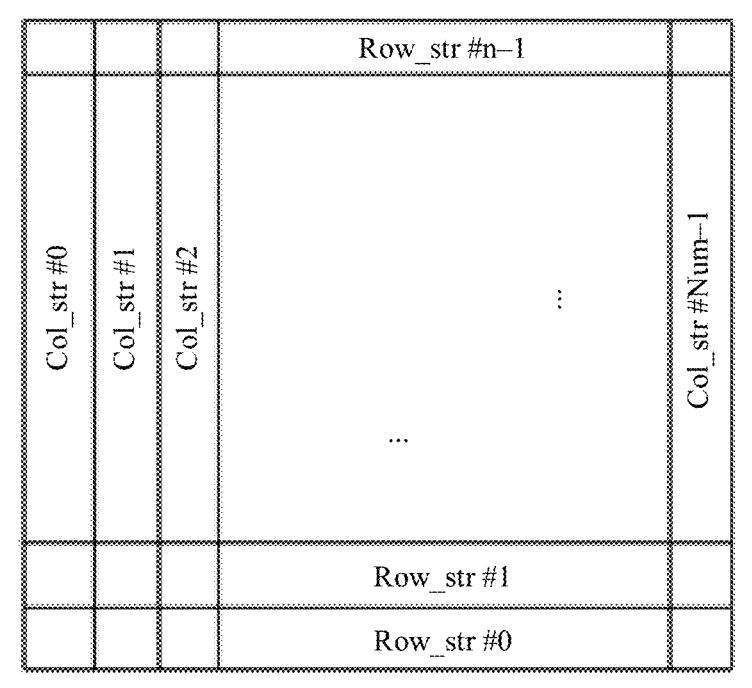

Another embodiment of this application further provides a manner of coding an FEC frame. The FEC frame includes Num to-be-transmitted codewords as described in the foregoing embodiment, which may be stored in a memory in a manner shown in FIG. 6. Each column is a to-be-transmitted codeword, and Num is a positive integer greater than 1.

When the FEC frame is generated through coding at a specific moment, based on the description in the foregoing embodiment, n bits need to be additionally supplemented to each generated to-be-transmitted codeword (the to-be-transmitted codeword includes n bits). The n bits are from some previously formed codewords. In this embodiment, the supplemented bit is denoted as Info_Pad. Therefore, n rows and Num columns of Info_Pad needs to be additionally supplemented to generate the FEC frame. It is assumed that Info_Pad is from T previously formed FEC frames. A bit of Info_Pad may be represented by (Row_Inf, Col_Inf), where Row_Inf is a row number of Info_Pad and is any value in 0, 1, 2, . . . , and n−1; and Col_Inf is a column number of Info_Pad and is any value in 0, 1 2, . . . , and Num−1. A bit in the T previously formed FEC frames is represented by (Frame, Row_str, Col_str), where Frame is a number of the FEC frame and is any value in 0, 1, 2, . . . , and T−1. The zero$^{th}$ frame is the FEC frame generated at a last moment, the first frame is the FEC frame generated at a moment previous to the last moment, and so on. Row_str is a row number of the FEC frame and is any value in 0, 1, 2, . . . , and n−1. Col_str is a column number of the FEC frame and is any value in 0, 1, 2, . . . , and Num−1. In this case, a correspondence between each bit in Info_Pad and a bit in the previously formed FEC frame may be calculated according to the following formulas:

$$\text{Frame}=\text{floor}((\text{Intial\_Row}+\text{Row\_skip}*\text{Row\_Inf})/n) \quad (1)$$

$$\text{Row\_str}=\text{Intial\_Row}+\text{Row\_skip}*\text{Row\_Inf}+\text{floor}(\text{Row\_skip}*\text{Row\_Inf}/n))\% \ n \quad (2)$$

$$\text{Col\_str}=(\text{Col\_Inf}+\text{Row\_Inf})\text{Num} \quad (3)$$

Intial_Row represents a row number of a first row of bits, in the T FEC frames, that are shared with Info_Pad, and Row_skip represents a specific quantity of rows that need to be spaced in the T FEC frames to select a row of bits to be shared with Info_Pad. It should be noted that Intial_Row is an integer not less than 0, Row_skip is a positive integer, and Intial_Row+Row_skip*(n−1) cannot exceed a value of n*(T−1).

The T FEC frames formed before a current moment that are mentioned herein may be T FEC frames at any previous moment. For example, the T FEC frames are FEC frames at T consecutive moments before the current moment, may be T FEC frames that are continuously obtained after an interval of a specific fixed moment from the current moment, or may be FEC frames at any T inconsecutive moments before the current moment. This is not limited in this application.

Figure 7:
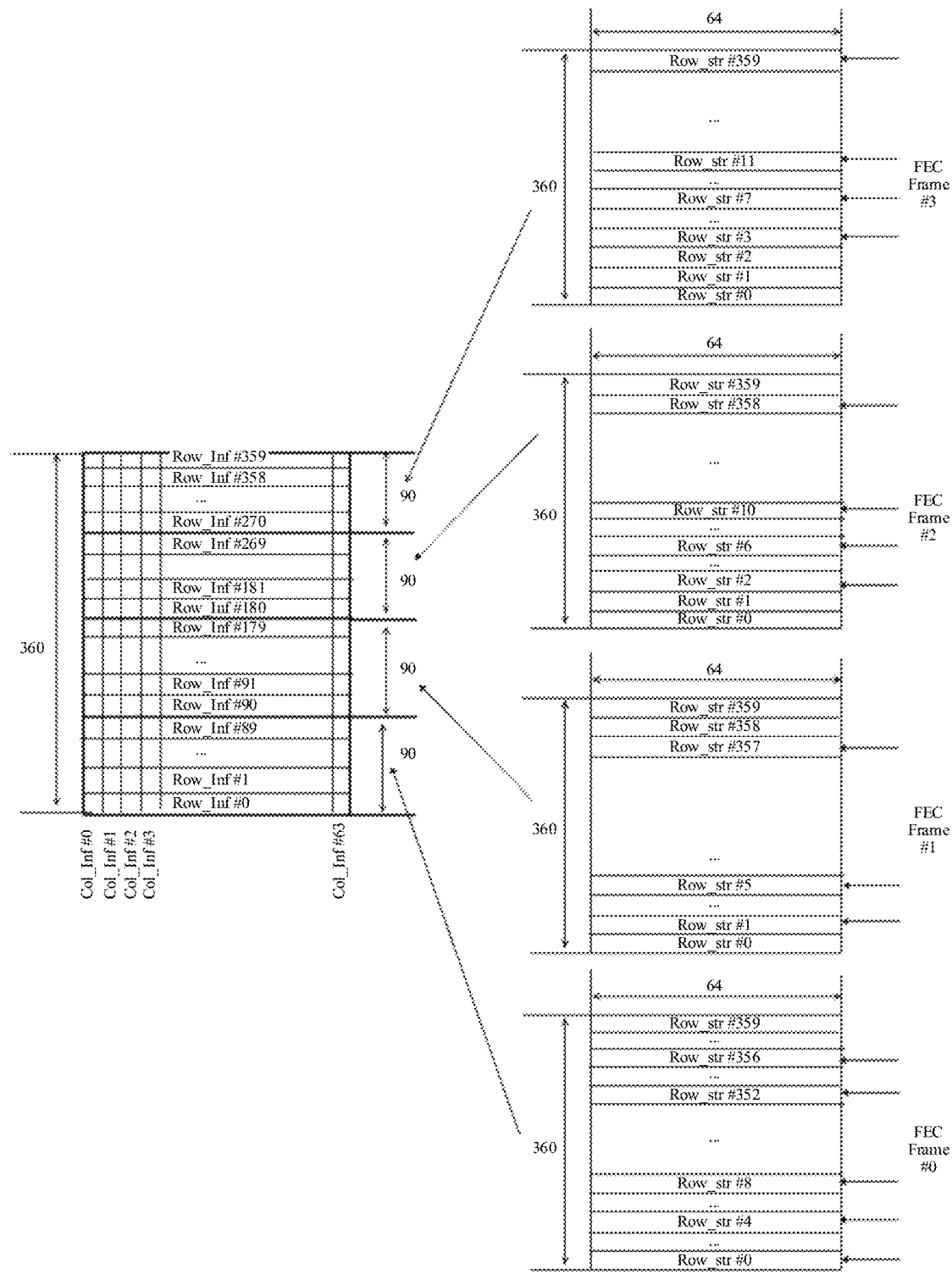
FIG. 7 is a diagram of composition of bits that need to be supplemented to an FEC frame according to another embodiment of this application.

Specifically, specific composition of Info_Pad is described below by using an example in which the to-be-transmitted codeword is a BCH (360, 340), and the FEC frame includes 64 to-be-transmitted codewords. To generate the FEC frame, 360 rows and 64 columns of Info_Pad needs to be additionally supplemented. Assuming that Info_Pad is from four previously formed FEC frames, which include 256 codewords in total, composition of Info_Pad is shown in FIG. 7. In this case, a row number Row_Inf of Info_Pad is any value in 0, 1, 2, . . . , and 359; a column number Col_Inf of Info_Pad is any value in 0, 1 2, . . . , and 63; a number Frame of the FEC frame is any value in 0, 1, 2, and 3; a row number Row_str of the FEC frame is any value in 0, 1, 2, ..., and 359; and a column number of the FEC frame is any value in 0, 1 2, ..., and 63.

In the composition shown in FIG. 7, an initial row number is 0, and a row of bits are selected at intervals of four rows to share with Info_Pad, that is, Intial_Row=0 and Row_skip=4. In this case, the formulas for the correspondence between each bit in Info_Pad and a bit in the previously formed FEC frame may be simplified as follows:

$$\text{Frame}=\text{floor}(\text{Row\_Inf}/90) \quad (4)$$

$$\text{Row\_str}=(4*\text{Row\_Inf}+\text{floor}(\text{Row\_Inf}/90))\%360 \quad (5)$$

$$\text{Col\_str}=(\text{Col\_Inf}+\text{Row\_Inf})\%64 \quad (6)$$

With reference to the formulas (4) and (5) and FIG. 7, it may be learned that when Row_Inf=0, Frame=0 and Row_str=0, to be specific, the $zero^{th}$ row of Info_Pad corresponds to the $zero^{th}$ row of the $zero^{th}$ frame in the four previously formed FEC frames. When Row_Inf=89, Frame=0 and Row_str=356, to be specific, the $89^{th}$ row of Info_Pad corresponds to the $356^{th}$ row of the $zero^{th}$ frame in the four previously formed FEC frames. When Row_Inf=90, Frame=1 and Row_str=1, to be specific, the $90^{th}$ row of Info_Pad corresponds to the first row of the first frame in the four previously formed FEC frames.

After it is determined, according to the formulas (4) and (5), a specific row that is of a specific frame and that corresponds to each row of Info_Pad, it may be further determined, according to the formula (6), a specific bit that is in a corresponding row of a corresponding FEC frame and that is shared with any bit in a specific row of Info_Pad. For example, when Row_Inf=0, Col_str=Col_Inf, to be specific, in the $zero^{th}$ row of Info_Pad, the $zero^{th}$ bit is shared with the $zero^{th}$ bit in a corresponding row, the first bit is shared with the first bit in the corresponding row, and so on. When Row_Inf=1, Col_str=Col_Inf+1, to be specific, in the first row of Info_Pad, the $zero^{th}$ bit is shared with the first bit in a corresponding row, the first bit is shared with the second bit in the corresponding row, and so on. When Row_Inf=64, Col_str=Col_Inf, to be specific, in the $64^{th}$ row of Info_Pad, the $zero^{th}$ bit is shared with the $zero^{th}$ bit in a corresponding row, and the first bit is shared with the first bit in the corresponding row. A sharing relationship of the $64^{th}$ row of Info_Pad is consistent with a sharing relationship of the $zero^{th}$ row of Info_Pad.

In conclusion, the formula (6) provides an interleaving relationship between each row of Info_Pad and a corresponding row in the previous FEC frame, and a row interleaving period is 64, that is, the interleaving relationship is repeated once every 64 rows. For example, in the $zero^{th}$ to the $63^{rd}$ row of Info_Pad, interleaving relationships between the rows and corresponding rows in the previous FEC frame are different. However, the interleaving relationship starts to be repeated from the $64^{th}$ row. For example, the interleaving relationship of the $zero^{th}$ row of Info_Pad is the same as that of the $64^{th}$ row, and the interleaving relationship of the first row is the same as that of the $65^{th}$ row, and so on. It should be understood that another row interleaving relationship may be used, for example, interleaving calculation is performed based on a Galois field (Galois Field, GF).

Figures 8, 9:
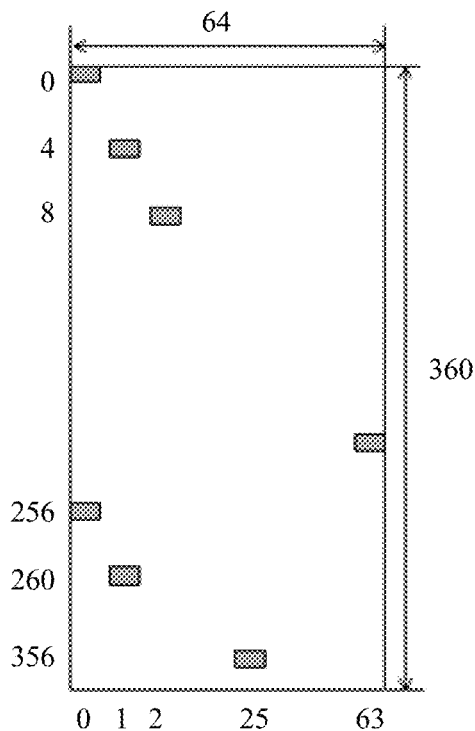
FIG. 8 is a diagram of a rule of sharing a column of bits that need to be supplemented to an FEC frame according to another embodiment of this application.
FIG. 9 is a flowchart of a decoding method according to another embodiment of this application.

In this embodiment, every 5760 bits (90 rows×64 columns) of Info_Pad are from one previously formed FEC frame. Because the row interleaving period is 64, in the 90 rows of bits, 26 rows of bits can only repeatedly use the interleaving relationship used by another row. FIG. 8 shows a sharing relationship between 90 bits included in the first column of Info_Pad and bits in a corresponding FEC frame.

A solid block in FIG. 8 indicates a location of a bit that is in the FEC frame and that is shared with the first column of Info_Pad. The sharing relationship meets conditions in the formulas (5) and (6). For example, Info_Pad (0, 0) is shared with a bit at a location of a solid block (0, 0) in FIG. 8, Info_Pad (1, 0) is shared with a bit at a location of a solid block (4, 1) in FIG. 8, Info_Pad (2, 0) is shared with a bit at a location of a solid block (8, 2) in FIG. 8, Info_Pad (64, 0) is shared with a bit at a location of a solid block (256, 0) in FIG. 8, and Info_Pad (89, 0) is shared with a bit at a location of a solid block (356, 25) in FIG. 8, where (a, b) represents the $a^{th}$ row the $b^{th}$ column.

It may be learned from FIG. 8 that in the FEC frame, the $zero^{th}$ to the $25^{th}$ columns each share 2 bits with the $zero^{th}$ column of Info_Pad, and the 26th to the $63^{rd}$ columns each share 1 bit with the $zero^{th}$ column of Info_Pad. Likewise, it may be deduced that 90 bits included in each column of Info_Pad share 2 bits with each of 26 previously formed to-be-transmitted codewords, and share 1 bit with each of the other 38 previously formed to-be-transmitted codewords. Each column of Info_Pad includes 360 bits, and every 90 rows correspond to one previously formed FEC frame. Therefore, each column of Info_Pad shares 2 bits with each of 104 (26×4=104) previously formed to-be-transmitted codewords, and shares 1 bit with each of other 152 (38×4=152) previously formed to-be-transmitted codewords.

In conclusion, in a process of generating a to-be-transmitted FEC frame through coding, using the first column of bits (the first column of bits are denoted as a first to-be-transmitted codeword) in the to-be-transmitted FEC frame as an example, generation of the first to-be-transmitted codeword is related to the first column of bits of Info_Pad and the 340 received current information bits, to be specific, the 360 bits included in the first column of Info_Pad are coded together with the 340 received current information bits based on the generator polynomial corresponding to the BCH (720, 700), to generate 20 check bits. The 340 current information bits and the 20 generated check bits constitute the first to-be-transmitted codeword. By analogy, 64 to-be-transmitted codewords may be obtained through coding, to jointly form a currently coded FEC frame.

In short, a coding process of the FEC frame is as follows.

First, a to-be-transmitted information bit is received. A quantity of to-be-transmitted information bits is 340 in this embodiment.

Then, 360 bits are obtained from 256 previously formed codewords in the manner provided in this embodiment.

Further, the 360 bits are coded together with received 340 bits to generate 20 check bits, and the 340 received bits and the 20 generated bits are sent. The 340 received bits and the 20 generated check bits constitute a first to-be-transmitted codeword, and 64 first to-be-transmitted codewords constitute an FEC frame.

In an actual coding process, one coder may perform coding, or a plurality of coders may perform parallel coding. For example, eight coders perform parallel coding to obtain eight to-be-transmitted codewords, and then parallel-to-serial conversion is performed to form a bit stream for sending.

It should be understood that, that the to-be-transmitted codeword is a BCH (360, 340) is merely a possible embodiment, and the to-be-transmitted codeword may have another length, for example, a BCH (510, 490) or a BCH (256, 238); or different coding rules such as a Hamming code and a Reed-solomon (Reed-solomon, RS) code may be used. This is not limited in this application.

According to the coding method disclosed in this embodiment, the bit in the to-be-transmitted codeword included in each FEC frame is protected by to-be-transmitted codewords included in a plurality of FEC frames generated at different moments, so that a better coding gain can be obtained. In addition, different codewords share different quantities of bits with each other. Codewords that share more bits with each other have a higher convergence speed, and then convergence of another codeword can be driven, thereby improving a convergence speed of a decoder and reducing a delay.

This application provides a decoding method for data communication. As shown in FIG. 9, the method includes the following steps.

901. Recover a first codeword, where the first codeword includes 2n bits and is formed by using k coding bits, n bits in the first codeword are from m codewords decoded before the first codeword, the other n bits in the first codeword include (k−n) information bits and (2n−k) check bits, n, m, and k are all positive integers, and 2n>k>n>m.

902. Decode the first codeword to obtain a decoded bit.

It should be understood that in this embodiment, at least m codewords are decoded before the first codeword is recovered. Half of the bits in the first codeword are from the m previously decoded codewords, and the other n bits are a bit stream received at a current moment. Generally, the first codeword shares a bit with a previously decoded codeword and a subsequently decoded codeword. Each bit in the first codeword is located in at least one previously decoded or subsequently decoded codeword. In addition, in some embodiments, at least some of the k coding bits in the first codeword are data bits in another codeword, and at least some of the k coding bits are check bits in another codeword.

Generally, in a received codeword stream, some initial codewords need to include padding bits, for example, an all-0 bit sequence is filled, until a sufficient quantity of codewords are decoded. For example, as described in this embodiment of this application, when initial m codewords are received, because m previously decoded codewords do not exist, enough coding bits cannot be obtained from the previously decoded codewords. Therefore, some padding bits need to be added to the codewords to supplement a quantity of coding bits, to perform decoding. It should be understood that in the initial received m codewords, a codeword other than the first codeword may share a part of bits from a previously decoded codeword, and then the remaining part of bits are filled. Alternatively, the codeword may not share a bit with the previously decoded codeword, and all missing coding bits are replaced with padding bits. This is not limited herein in this application. In addition, a decoder side should be consistent with a coding end in terms of whether the padding bits are an all-0 bit sequence or another form of bit sequence, to perform correct decoding.

In this embodiment of this application, some error bits in a previously decoded codeword are corrected. After bits in the previously decoded codeword form a codeword with a bit received at a current moment, a quantity of error bits in the formed codeword decreases, and a probability of correct decoding may increase. Further, after this decoding, in addition to an error in the bit newly received at the current moment, a remaining error in the previous codeword may be corrected, thereby improving an error correction capability. In addition, different codewords share different quantities of bits with each other, and a plurality of codewords may share more than 1 bit. A larger quantity of shared bits indicates a decrease in a quantity of codewords that need to be associated, so that decoding can be performed without waiting for a long time, thereby reducing a system delay.

Figure 10:
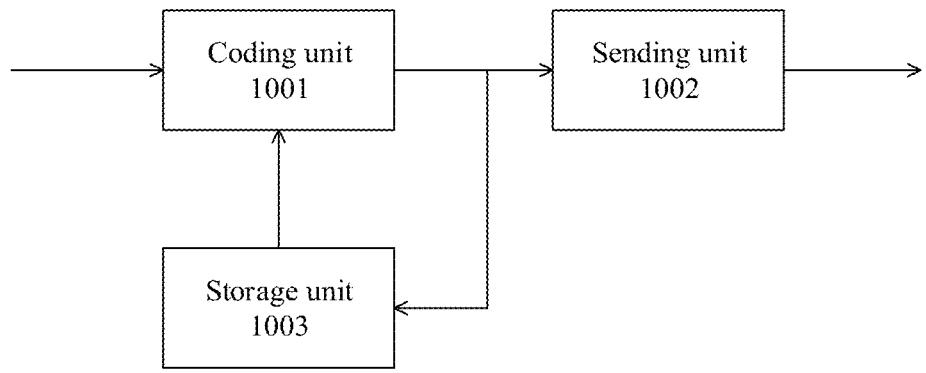
FIG. 10 is a diagram of a coding apparatus according to another embodiment of this application.

Another embodiment of this application provides a coding apparatus for data communication. As shown in FIG. 10, the coding apparatus includes a coding unit 1001 and a sending unit 1002. The coding unit 1001 receives a to-be-transmitted information bit, codes the to-be-transmitted information bit to form a to-be-transmitted codeword, and sends the formed codeword to the sending unit 1002. The sending unit 1002 is configured to send the received codeword. Further, the coding apparatus includes a storage unit 1003, configured to store the to-be-transmitted codeword, and send the to-be-transmitted codeword back to the coding unit 1001. In a coding process, the coding unit 1001 uses a bit in a previously formed codeword to generate a new to-be-transmitted codeword through coding.

In the coding process, a first codeword is formed. The first codeword includes 2n bits and is formed by using k coding bits, where n bits in the first codeword are from m codewords formed before the first codeword, the other n bits in the first codeword include (k−n) information bits and (2n−k) check bits, n, m, and k are all positive integers, and 2n>k>n>m. During sending, the bits from the previous m codewords do not participate in data transmission, and the other n bits (that is, a to-be-transmitted codeword) in the first codeword are sent. A specific coding process is the same as that described in the foregoing embodiment. Details are not described again in this embodiment.

Figure 11:
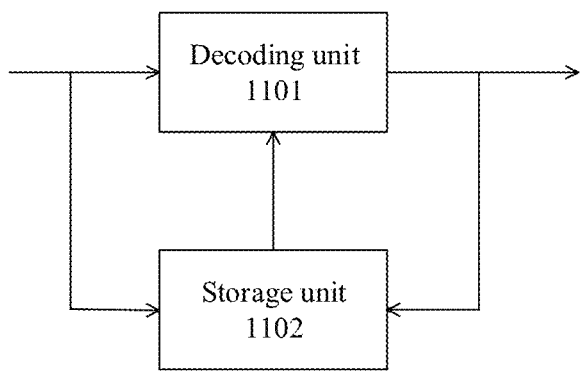
FIG. 11 is a diagram of a decoding apparatus according to another embodiment of this application.

Another embodiment of this application provides a decoding apparatus for data communication. As shown in FIG. 11, the decoding apparatus includes a decoding unit 1101 and a storage unit 1102. The decoding unit 1101 is configured to receive a transmitted codeword, recover a first codeword, and decode the first codeword. The storage unit 1102 is configured to store the transmitted codeword, receive decoding information from the decoding unit 1101, update the stored codeword, and send an updated codeword back to the decoding unit 1101 in a subsequent decoding process. In a decoding process, the decoding unit 1101 uses an information bit obtained in previous decoding, and the information bit is protected by different codewords, so that decoding performance is better.

In the decoding process, a first codeword is formed. The first codeword includes 2n bits, and n bits in the first codeword are from m codewords decoded before the first codeword, where both n and m are positive integers, and n>m. In this case, the n bits are decoded in a previous decoding process. Therefore, a quantity of error bits decreases, and a decoding success rate of the first codeword is improved. For example, a codeword (x−1) includes y errors before decoding, and some error bits in the codeword (x−1) are corrected after decoding. Because some errors in the codeword (x−1) are corrected, another codeword that cannot be corrected previously and that shares a bit with the codeword (x−1) may currently have a sufficient quantity of correct bits, so that the codeword that cannot be corrected previously becomes correctable. By analogy, the codeword can be repeatedly decoded.

Figure 12:
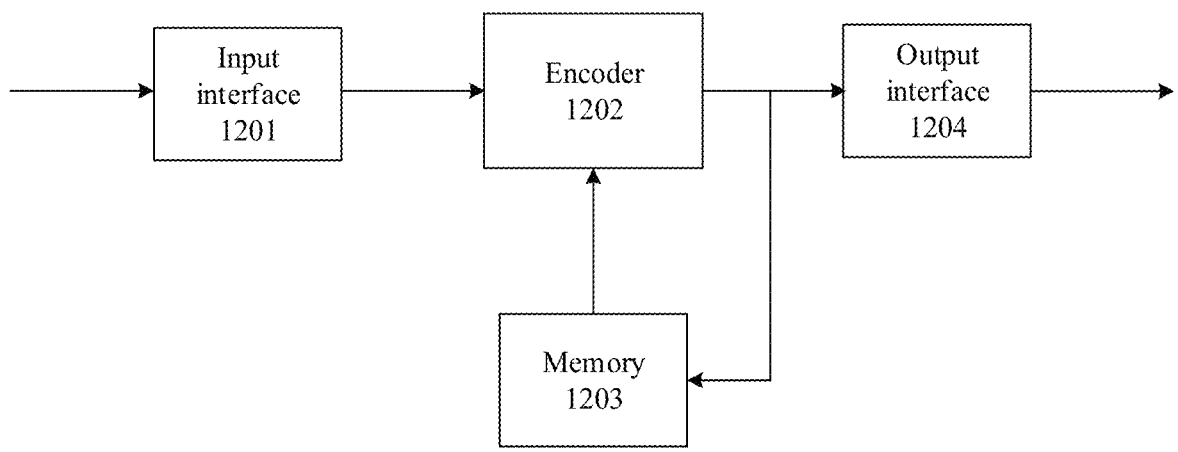
FIG. 12 is a diagram of a coding apparatus according to another embodiment of this application.

Another embodiment of this application provides a coding apparatus for data communication. As shown in FIG. 12, the coding apparatus includes an input interface 1201, a coder 1202, a memory 1203, and an output interface 1204. The coder 1202 is configured to receive information data by using the input interface 1201 and send a generated codeword by using the output interface 1204. The memory 1203 is configured to store the codeword sent by the coder 1202 and send the codeword back to the coder 1202 in a subsequent coding process. In a coding process, the coder 1202 uses a bit in a previously formed codeword to generate a new codeword through coding. A specific coding process is the same as that described in the foregoing embodiment. Details are not described herein again.

Further, the memory shown in FIG. 12 is a component independent of the coder. In an actual case, a storage function may also be implemented in the coder, that is, a separate memory does not need to exist. In addition, the memory 1203 may receive information data from the input interface 1201 and receive check data from the coder 1202. This is not limited in this application.

Figure 13:
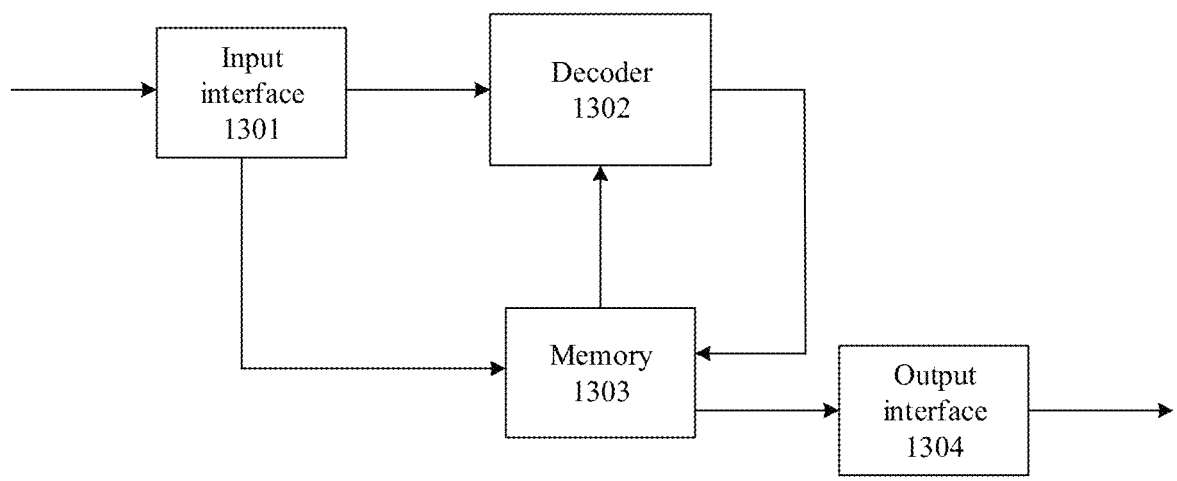
FIG. 13 is a diagram of a decoding apparatus according to another embodiment of this application.

In addition, another embodiment of this application further provides a decoding apparatus for data communication. As shown in FIG. 13, the decoding apparatus includes an input interface 1301, a decoder 1302, a memory 1303, and an output interface 1304. The decoder 1302 is configured to receive a sent codeword by using the input interface 1301 and decode the codeword. The memory 1303 is configured to store a codeword from the input interface 1301, receive decoding information from the decoder 1302, update the stored codeword, and send an updated codeword back to the decoder 1302 in a subsequent decoding process. The memory 1303 may further send the updated codeword by using the output interface 1304. In a decoding process, the decoder 1302 uses an information bit obtained in previous decoding, so that a decoding capability is improved. Likewise, in the decoding apparatus, a storage function may also be implemented in the decoder, that is, a separate memory may not exist.

An embodiment of this application provides a computer-readable storage medium or a computer program product that is configured to store a computer program. The computer program is used to execute the coding or decoding method in the method embodiment of this application.

It may be understood that FIG. 12 shows only a simplified design of the coding apparatus. In actual application, the coding apparatus may include any quantity of interfaces, coders, and the like, and all terminals that can implement the embodiments of this application fall within the protection scope of the embodiments of this application. Likewise, the decoding apparatus may also include any quantity of interfaces, decoders, and the like, to implement parallel decoding and improve decoding efficiency.

It should be further understood that in the embodiment of this application, the processor may be a central processing unit (Central Processing Unit, CPU), or may be another general purpose processor, a digital signal processor (DSP), an application-specific integrated circuit (ASIC), a field programmable gate array (FPGA), or another programmable logic device, discrete gate or transistor logic device, discrete hardware component, and or the like. The general-purpose processor may be a microprocessor, or the processor may be any conventional processor or the like.

Figure 14:
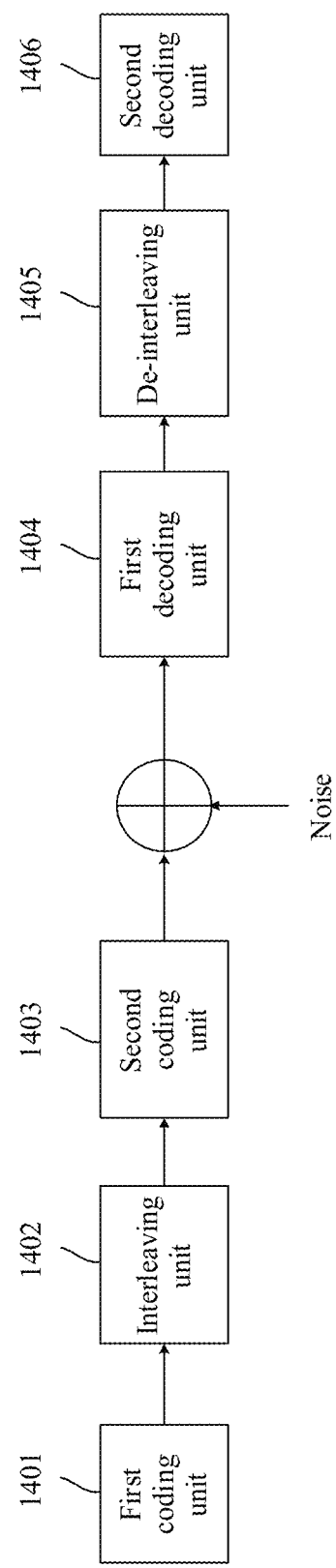
FIG. 14 is a diagram of a structure of a high-speed transmission system according to another embodiment of this application.

The coding solution disclosed in this application may be used in a high-speed transmission system, such as an 800G transmission system. A structure of the high-speed transmission system is shown in FIG. 14. A transmit end includes a first coding unit 1401, an interleaving unit 1402, and a second coding unit 1403. The first coding unit 1401 is configured to receive a data bit stream, perform KP4 coding on the received data bit stream, and send a bit stream obtained through coding to the interleaving unit 1402. The interleaving unit 1402 is configured to interleave the received bit stream and send an interleaved bit stream to the second coding unit 1403. The second coding unit 1403 is configured to perform the coding method disclosed in the foregoing embodiment on the interleaved bit stream, and send a generated codeword. A specific coding manner is not described in detail herein.

It should be noted that the KP4 codeword is an RS (544, 514, 15, 10), that is, the KP4 codeword includes 544 symbols, where 514 symbols are information symbols. Errors of a maximum of 15 symbols can be corrected at one time of decoding, and each symbol includes 10 bits. The interleaving unit may process the received bit stream in a row-column interleaving manner, that is, write a bit in a row form and read the bit in a column form, to implement an interleaving function. This is an interleaving method that is relative easy to implement. Certainly, another interleaving method may be used. This is not limited in this application.

Further, a receive end of the high-speed transmission system includes a first decoding unit 1404, a de-interleaving unit 1405, and a second decoding unit 1406. The first decoding unit 1404 is configured to receive a codeword sent by the transmit end, perform the decoding method disclosed in the foregoing embodiment on the received codeword, and send a bit stream obtained through decoding to the de-interleaving unit 1405. The de-interleaving unit 1405 is configured to perform de-interleaving on the received bit stream and send a de-interleaved bit stream to the second decoding unit 1406. The second decoding unit 1406 is configured to perform KP4 decoding on the de-interleaved bit stream to obtain an original data bit. According to the high-speed transmission system provided in this embodiment, KP4 coding and the coding method provided in the foregoing embodiment are used to perform concatenated coding, which can enhance coding performance, and meet a coding performance requirement that is increasingly high as an optical transmission rate increases.

Figure 15:
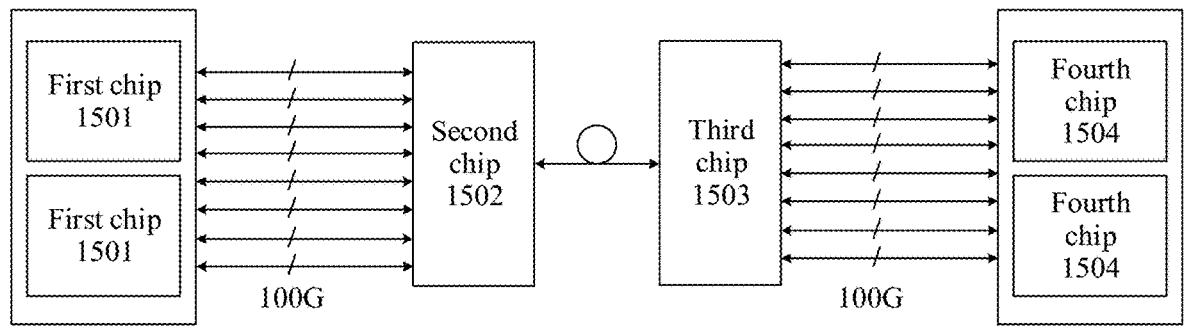
FIG. 15 is a diagram of a structure of an 800G transmission system according to another embodiment of this application.

In addition, in an actual high-speed transmission system, KP4 coding and the coding method disclosed in this application are implemented in different chips. Using an 800G transmission system as an example, a basic structure of the 800G transmission system is shown in FIG. 15. KP4 coding is implemented in a first chip 1501, the coding method in this application is implemented in a second chip 1502, the decoding method disclosed in this application is implemented in a third chip 1503, and KP4 decoding is implemented in a fourth chip 1504. The two first chips jointly output eight 100G signals, to implement a function of transmitting an 800G signal. It should be understood that the 800G transmission system may include only one first chip to implement KP4 coding, and one first chip sends an 800G signal to the second chip. This is not limited in this application.

Specifically, the second chip 1502 receives a KP4 codeword transmitted by the first chip 1501. The second chip 1502 does not perform KP4 decoding, and directly codes the KP4 code with a check bit based on the coding method provided in the foregoing embodiment. Circuit noise exists due to interconnection between the first chip 1501 and the second chip 1502, which causes an error in correlated bits. Therefore, interleaving and de-interleaving need to be respectively performed at a transmit end and a receive end to break up correlation. To be specific, at the transmit end, the KP4 codeword is interleaved and then sent to the second chip 1502. Likewise, at the receive end, a codeword decoded by the third chip 1503 is de-interleaved and then sent to the fourth chip 1504. It should be noted that the first chip and the fourth chip may be integrated together, and the second chip and the third chip may be integrated together, to implement a receiving/transmission function. In addition, an interleaving function may be implemented in the first chip 1501 or the second chip 1502, and a de-interleaving function may be implemented in the third chip 1503 or the fourth chip 1504. This is not limited in this application.

To further reduce a delay and power consumption, a data allocation function and the interleaving function of an output port of the first chip may be integrated. To be specific, when KP4 data is distributed, a data sending sequence is scrambled to implement the interleaving function. Likewise, similar processing may also be performed at a decoder side.

Figure 16:
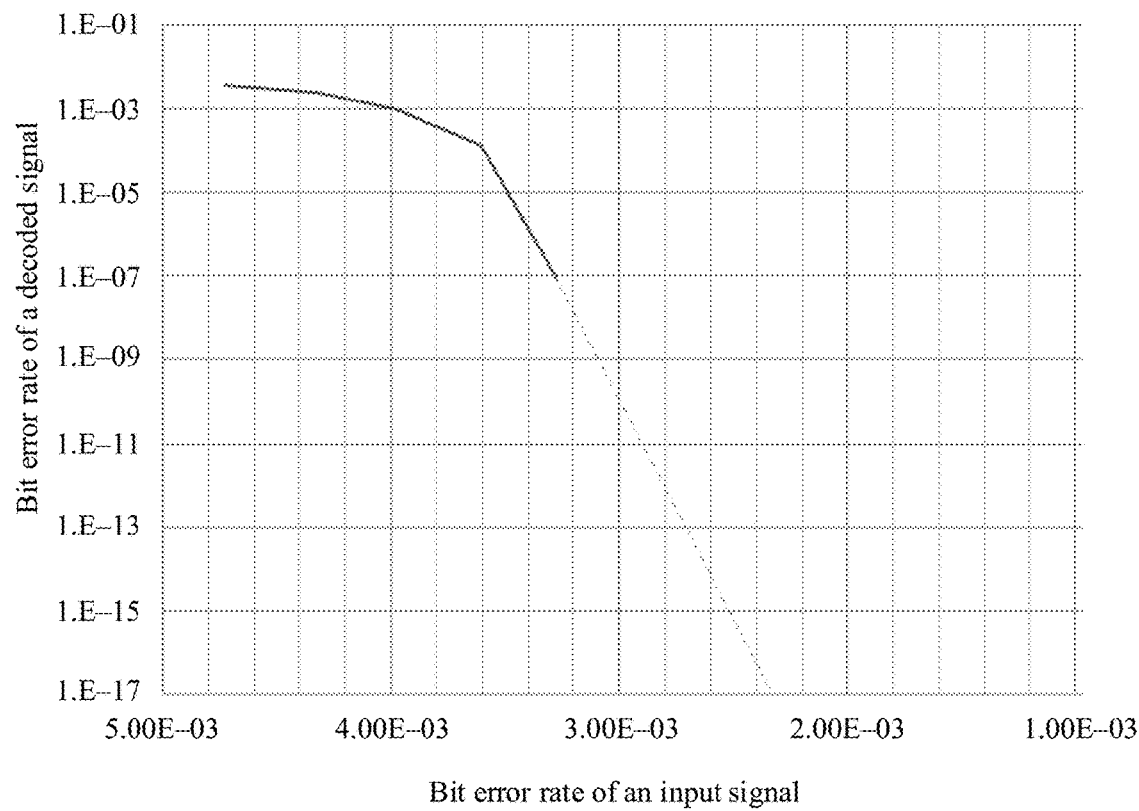
FIG. 16 is a diagram of a simulation result of applying a coding solution to an 800G transmission system according to this application.

Further, for example, the KP4 is concatenated with the FEC frame disclosed in the foregoing embodiment of this application. When a decoding delay (a coding delay is relatively small and is ignored herein) is only 170 ns, a simulation result of coding performance is shown in FIG. 16. When a bit error ratio (Bit Error Ratio, BER) of an input signal is 2.5E−3 or less, it can be ensured that a BER of a decoded signal is less than 1E−15. In other words, when a delay is relatively low, coding performance can also be ensured.

In this embodiment of this application, coding performance is improved by concatenating two different codewords. In addition, the KP4 does not need to be decoded at the transmit end, and the KP4 codeword is directly coded, to implement transparent transmission of the KP4 codeword thereby further reducing system power consumption.

Figure 17A:
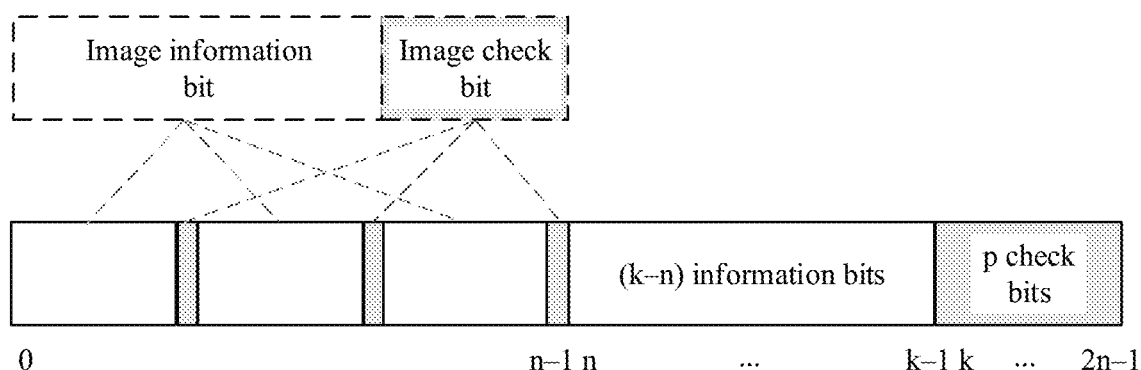
FIG. 17(*a*) is a schematic diagram of a codeword structure according to another embodiment of this application.

In this embodiment of this application, a codeword structure of another code is further provided. A specific structure is shown in FIG. 17(a). A code length of each codeword is 2n, a length of a coding bit in each codeword is k, and a length of a check bit is p=2n−k. An interleaving depth of coding is defined as m. The first n bits in each codeword are from data at previous m moments and are referred to as image bits. In the subsequent n bits, (k−n) bits are information bits at a current moment, and the remaining (p=2n−k) bits are referred to as check bits, where n, m, and k all are positive integers, and 2n>k>n>m. If the image bit is from an information bit at the previous moment, the image bit is referred to as an image information bit; or if the image bit is from a check bit at the previous moment, the image bit is referred to as an image check bit. The entire codeword may be referred to as a component code. In this embodiment, a BCH code or a shortened BCH code is used as a component code, and a quantity of error correction bits in the component code is t.

Figure 17B:
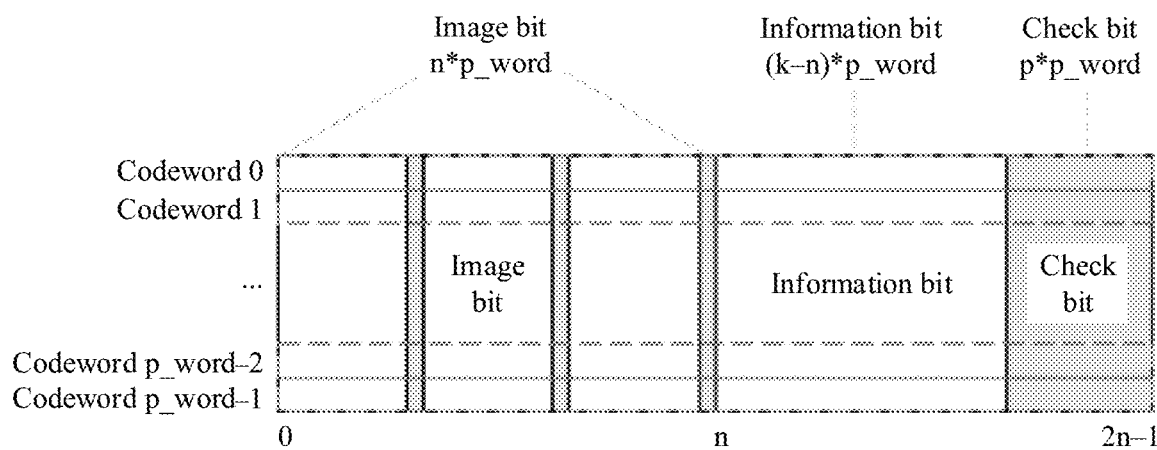

A plurality of component codes may constitute an FEC frame. A structure of the FEC frame is shown in FIG. 17(b). Each frame includes p_word component codewords, and p_word is an integer greater than 1. It should be understood that p_word in this embodiment has a same meaning as Num in the foregoing embodiment. All these component codes are coded simultaneously, and then information bits and check bits in all the component codes are combined for sending, which are a total of n*p_word bits. The n*p_word image bits are not transmitted on a channel. In addition, the FEC frame may be a spatially coupled code.

Figure 18:
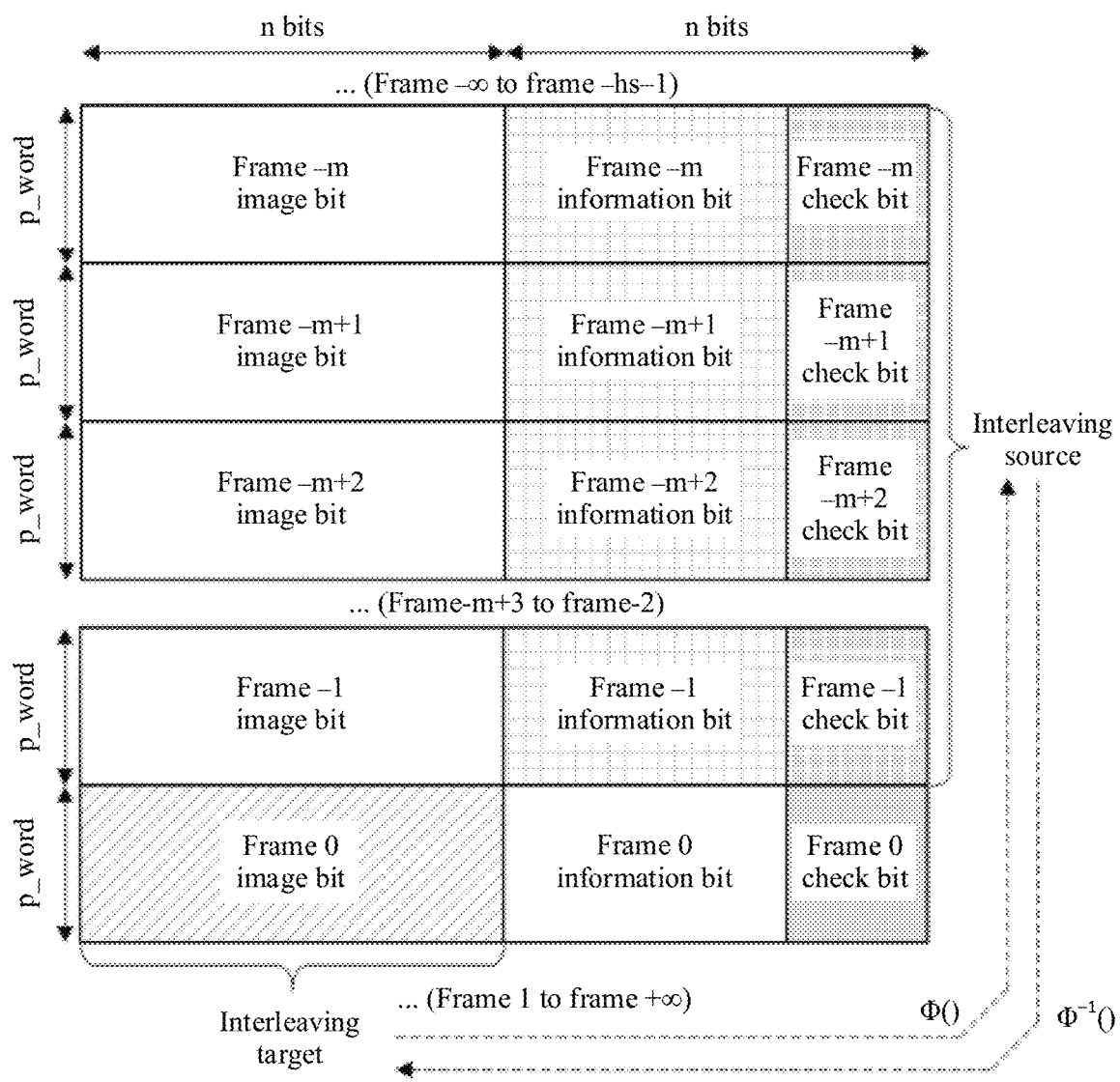
FIG. 18 is a schematic diagram of a codeword sharing rule according to another embodiment of this application.

As shown in FIG. 18, the FEC frame described in this solution may be described by a matrix of n columns and infinite rows. In the matrix, each row represents a component codeword, and consecutive p_word rows represent a frame shown in FIG. 17(b). Bits corresponding to each column have a same bit sequence number. It is assumed that a frame at a current moment is a frame 0. Based on the frame structure provided in FIG. 17(b), information bits and check bits in the frame are generated at the current moment, and image bits (a bit marked by an oblique line) in the current frame are obtained by interleaving and mapping information bits and check bits (bits marked by grids) in previous h frames (a frame−h to a frame −1). The image bits in the current frame are referred to as interleaving targets, and the information bits and the check bits in the previous h frames are referred to as interleaving sources. It should be understood that h in this embodiment has a same meaning as T in the foregoing embodiment.

A coordinate of a specific bit is denoted as (Frame, Row_str, Col_str), where a frame identifier Frame ∈(−∞, +∞), a row identifier Row_str∈[0, p_word−1], and a column identifier Col_str∈[0, 2n−1]. A function Φ([Frame, Row_str, Col_str]) is used to indicate a relationship of interleaving and mapping from an interleaving target to an interleaving source. Therefore, input and output of the function Φ( ) each are a coordinated in the matrix. $\Phi^{-1}$( ) is an inverse function of Φ( ) and indicates a relationship of mapping from an interleaving source to an interleaving target.

Figure 19:
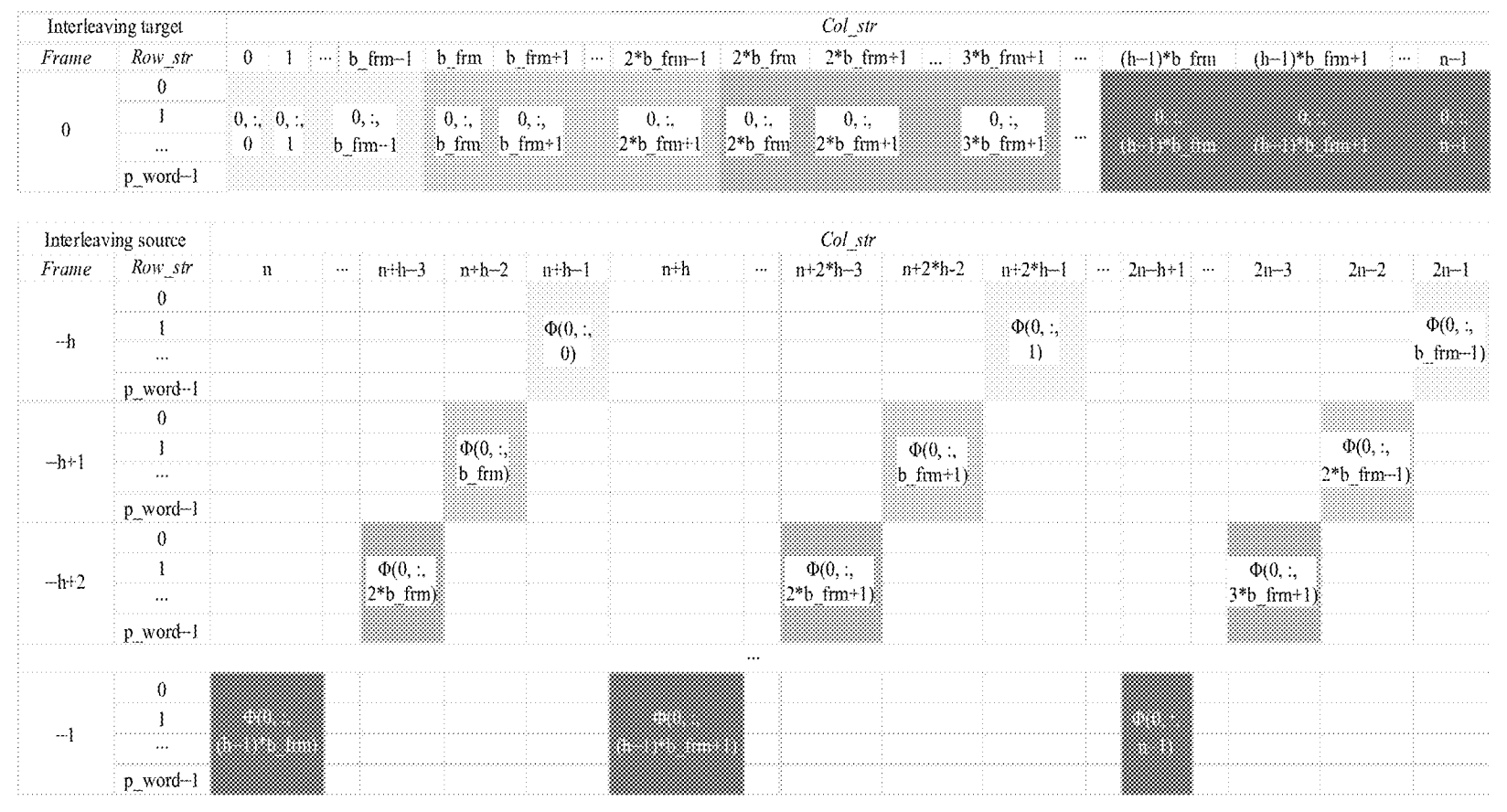

Specifically, FIG. 19 is a schematic diagram of an interleaving solution and describes a correspondence between an interleaving source and an interleaving target. For ease of representation, p_word bits with a same column coordinate in the interleaving target are expressed as {[0, :, Col_str]}={[0, 0, Col_str], [0, 1, Col_str], . . . , [0, p_word−1, Col_str]}. The p_word bits correspond to p_word bits in the interleaving source, and corresponding coordinates of the p_word bits are expressed as Φ({[0, :, Col_str]}) in FIG. 19.

A specific interleaving solution is described as follows.

A specific expression of the function Φ( ) is: Φ([Frame, Row_str, Col_str])=[Φf([Frame, Row_str, Col_str]), Φr([Frame, Row_str, Col_str]), Φc([Frame, Row_str, Col_str])].

For ease of representation, three sub-functions Φf( ) Φr( ), and Φc( ) are respectively used to indicate that a frame coordinate, a row coordinate, and a column coordinate of a bit in the interleaving source are calculated by using a coordinate of a bit in the interleaving target. Specific expressions of the functions are as follows:

Φf([Frame,Row_str,Col_str])=Frame−1−frm_map
  (floor((Col_str+Δ)/ceiling(b_frm)));

Φr([Frame,Row_str,Col_str])=(Col_str Row_str)%
  p_word; and

Φc([Frame,Row_str,Col_str])=n+h*((Col_str+Δ)%
  ceiling(b_frm))+(h−1−floor((Col_str+Δ)/ceiling
  (b_frm))).

The function ceiling( ) and the function floor( ) respectively round input up and down, ⊗ represents bitwise exclusive OR, % represents modulo;

frm_map represents a bijective function whose input field and output field each are {0, 1, . . . , h−1}; and in the interleaving solution in FIG. 19, corresponding frm_map(i)=h−1−i, where i∈[0, h−1];

"b_frm=n/h" represents an average quantity of bits obtained by each codeword in the interleaving target from each frame in the interleaving source; and Δ is an adjustment item, where if b_frm is an integer, Δ=0; or if b_frm is not an integer, a value of Δ is as follows:

if Col_str/floor(b_frm)<N_ext,Δ=floor(Col_str/floor
  (b_frm)); or if Col_str/floor(b_frm)≥N_ext,Δ=N_ext, where
  N_ext=ceiling(b_frm)*h−n.

Because bits in the interleaving source and bits in the interleaving target are in a one-to-one correspondence, the interleaving and mapping function Φ( ) is bijective. For a quantity h of interleaved and associated frames, a quantity p_word of codewords per frame, a code length 2n, and a function frm_map that are determinate, the interleaving mapping function Φ( ) exists and is uniquely determinate, where h, p_word, and 2n are independent of each other and are not mutually constrained. Therefore, even if p_word and 2n are determined, h can still be adjusted to balance decoding performance and a decoding delay.

Further, for the codeword in this application, the code length 2n is less than or equal to 2048, the quantity t of error correction bits in the component code BCH is less than or equal to 5, and the quantity h of frames included in the interleaving source is greater than 1. In this case, a constructed codeword can still have relatively good performance when ensuring a low delay. It should be understood that h FEC frames formed before a current moment that are mentioned herein may be h FEC frames at any previous moment. For example, the h FEC frames are FEC frames at h consecutive moments before the current moment, may be h FEC frames that are continuously obtained after an interval of a specific fixed moment from the current moment, or may be FEC frames at any h inconsecutive moments before the current moment. This is not limited in this application.

Based on the foregoing interleaving solution, if b_frm is an integer, each frame in the interleaving source provides b_frm bits for each codeword in the interleaving target; or if b_frm is not an integer, each of (ceiling(b_frm)−b_frm)*h frames in the interleaving source provides floor(b_frm) bits for each codeword in the interleaving target, and each of the remaining (b_frm−floor(b_frm))*h frames provides ceiling (b_frm) bits for each codeword in the interleaving target. In addition, the following is defined: "b_word=n/(h*p_word)" represents an average quantity of bits obtained by each codeword in the interleaving target from each codeword in the interleaving source. If b_word is an integer, each codeword in the interleaving source provides b_word bits for each codeword in the interleaving target; or if b_word is not an integer, each of (ceiling(b_word)−b_word)*(h*p_word) codewords included in the interleaving source provides floor(b_word) bits for each codeword in the interleaving target, and each of the remaining (b_word−floor(b_word)) *(h*p_word) codewords provides ceiling(b_word) bits for each codeword in the interleaving target. It may be learned that the interleaving target basically obtains a same quantity of bits from the codewords, and also basically obtains a same quantity of codewords from the frames, which indicates that the interleaving source is broken up sufficiently in the interleaving manner provided in this solution, thereby effectively improving decoding performance. In an example shown in FIG. 19, b_frm is an integer. It may be learned that each frame in the interleaving source provides p_word*b_frm bits for the interleaving target.

Further, this embodiment of this application further describes a location of an image check bit. For an FEC frame determined by a group of parameters h, p_word, and code length 2n shown in FIG. 19, locations of a total of p*p_word image check bits in the FEC frame are also determinate. For the image check bit, Frame=0 and Row_str∈[0, p_word−1]. All P coordinates Col_str are divided into h groups, and the following mainly defines Col_str corresponding to p image check bits.

First, the following is defined: Each group includes a total of h coordinates i_base, and each coordinate i_base represents a maximum value of a column coordinate Col_str of an image check bit from a frame in an image bit. If i<N_ext, i_base(i)=(i+1)*ceiling(b_frm)−i−2; or if i≥N_ext, i_base(i)=(i+1)*ceiling(b_frm)−N_ext−1, where 0≤i≤h−1.

Next, the following array is defined to represent a quantity of coordinates corresponding to each i_base: Range(i)=ceiling((p−i)/h), and Range=Range ROR N_ext, where ROR is cyclic right shifting of the array. In this case, a set including all coordinates Col_str is Col_str_vec(i, :)=[i_base(i)−Range(i)+1:i_base(i)].

It should be noted that, to distinguish between different types of interleaving solutions, the following definition is provided: If b_word is an integer, an association relationship is a regular pattern, and the interleaving solution is defined as a complete regular interleaving solution; if b_word is not an integer but b_frm is an integer, the interleaving solution is defined as a partial regular interleaving solution; or if neither b_word nor b_frm is an integer, the interleaving solution is defined as an irregular interleaving solution. The following provides specific examples of different types of interleaving solutions.

Figure 20:
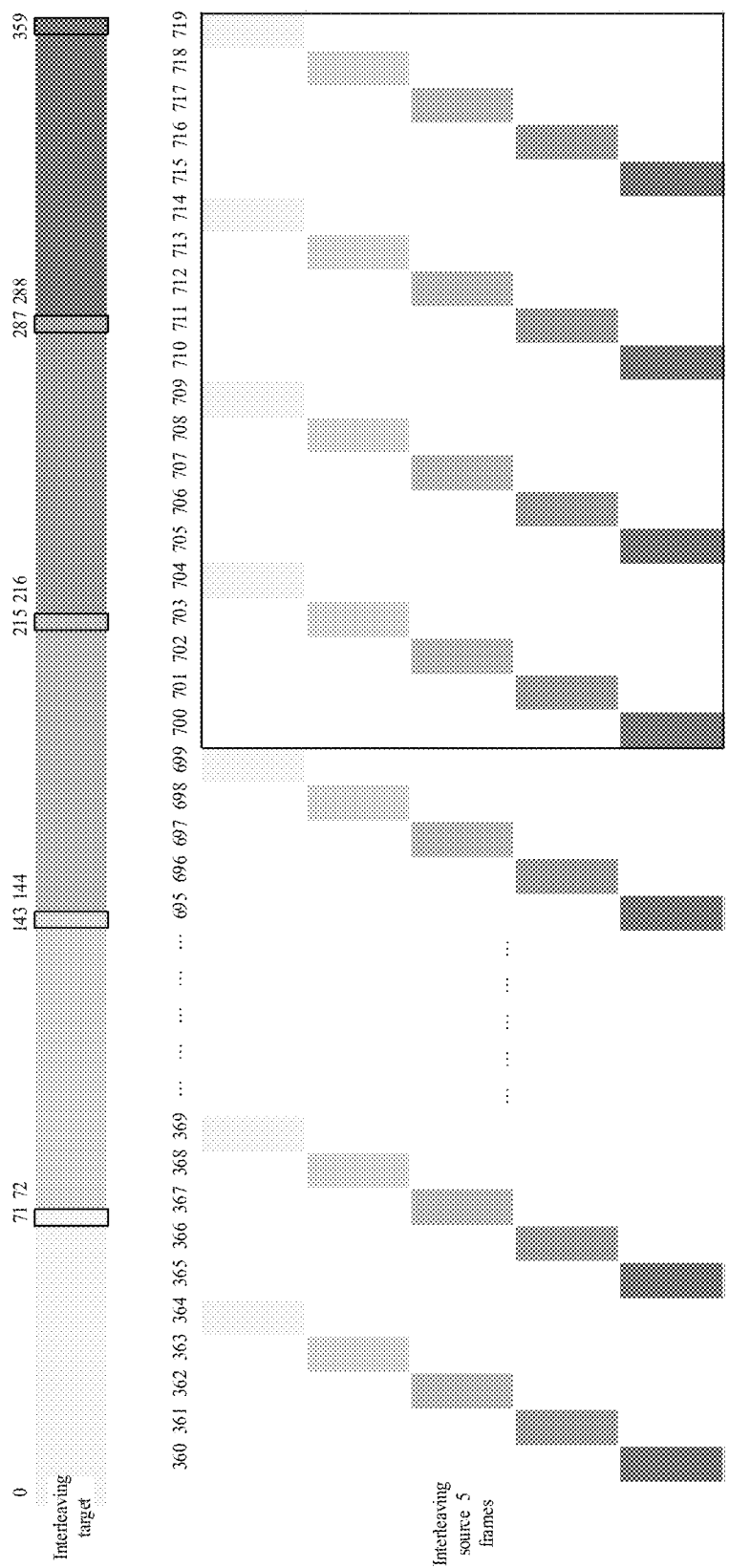
FIG. 20 is a schematic diagram of a specific interleaving solution for an FEC frame according to another embodiment of this application.

With reference to FIG. 20, this application provides a specific interleaving solution for an FEC frame. A quantity of frames included in an interleaving source is h=5, a quantity of codewords included in each frame is p_word=64, and a code included in the FEC frame is a BCH (720, 700) code. The BCH (720, 700) code may be a shortened BCH code obtained by shortening a BCH (1023, 1003) code in a Galois field GF (2^10) by 303 bits, and a quantity of error correction bits in the BCH code is t=2.

A corresponding interleaving and mapping function Φ( ) may be expressed as follows:

$$\Phi f([Frame,Row\_str,Col\_str])=Frame-1-frm\_map(floor((Col\_str)/72));$$

$$\Phi r([Frame,Row\_str,Col\_str])=(Col\_str \otimes Row\_str) \%64; \text{ and}$$

$$\Phi c([Frame,Row\_str,Col\_str])=360+5*((Col\_str)\%72)+(4-floor((Col\_str)/72)),$$

where frm_map(i)=4−i, and i∈[0, 4].

In the interleaving solution, 360 image bits in each codeword are from a total of 5*64 codewords in previous five frames. Specifically, b_frm=360/5=72, to be specific, each frame in the interleaving source provides 72 bits for each codeword in an interleaving target; and b_word=360/(5*64)=1.125, to be specific, each of (ceiling(1.125)−1.125)*(5*64)=280 codewords in the interleaving source provides floor(1.125)=1 bit for each codeword in the interleaving target, and each of the remaining (1.125-floor(1.125))*(5*64)=40 codewords provides ceiling(1.125)=2 bits for each codeword in the interleaving target. Therefore, the interleaving solution in this embodiment is a partial regular interleaving solution. In the interleaving solution, a difference between quantities of bits obtained by the interleaving target from the codewords is very small, which indicates that the interleaving source is broken up sufficiently in the interleaving manner provided in this solution, thereby effectively improving decoding performance.

Further, in the FEC frame provided in this embodiment of this application, each component code (that is, a codeword in the interleaving target) includes 20 image check bits, and the 20 image check bits are divided into five groups. Because N_ext=ceiling(b_frm)*h−n=ceiling(360/5)*5−360=0, and i≥N_ext, according to a formula i_base(i)=(i+1)*ceiling(b_frm)−N_ext−1, a corresponding value of Col_str is calculated as follows:

$$i\_base([0,1,2,3,4])[71,143,215,287,359].$$

Figure 21:
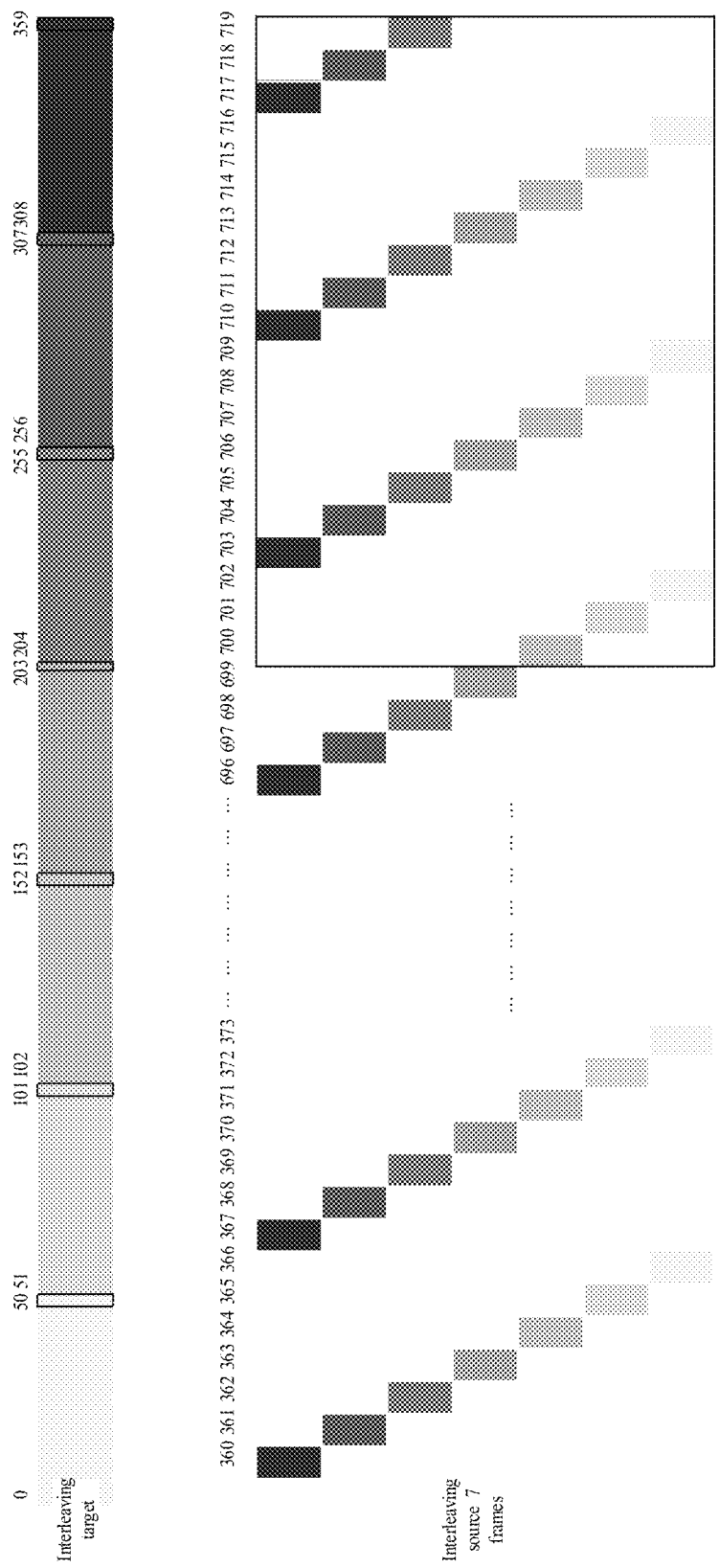
FIG. 21 is a schematic diagram of a specific interleaving solution for an FEC frame according to another embodiment of this application.

Further, because Range(i)=ceiling((p−i)/h), 0≤i≤h−1, and Range=Range ROR N_ext, Range([0, 1, 2, 3, 4])[4, 4, 4, 4]. Therefore, a set of column coordinates of the 20 image check bits included in each codeword in the interleaving target is Col_str_vec={[68, 69, 70, 71], [140, 141, 142, 143], [212, 213, 214, 215], [284, 285, 286, 287], [356, 357, 358, 359]}. It should be noted that in this embodiment of this application, sets of column coordinates of image check bits in the codewords in the interleaving target are the same. Another embodiment of this application provides another interleaving solution for an FEC frame. A schematic diagram of the interleaving solution is shown in FIG. 21. A quantity of frames included in an interleaving source is h=7, a quantity of codewords included in each frame is p_word=64, and a code included in the FEC frame is a BCH (720, 700) code. The BCH (720, 700) code is a shortened BCH code obtained by shortening a BCH (1023, 1003) code in a Galois field GF (2^10) by 303 bits, and a quantity of error correction bits in the BCH code is t=2.

A corresponding interleaving and mapping function Φ( ) may be expressed as follows:

Φf([Frame,Row_str,Col_str])=Frame−1−frm_map
(floor((Col_str+Δ)/52));

Φr([Frame,Row_str,Col_str])=(Col_str⊗Row_str)
%64; and

Φc([Frame,Row_str,Col_str])=360+7*((Col_str+Δ)
%52)+(6−floor((Col_str+Δ)/52)), where
frm_map(i)=i, and i∈[0,6], where when Col_str/
51<4,Δ=floor(Col_str/51); or when Col_str/
51≤4,Δ=4.

In the interleaving solution, 360 image bits in each codeword are from a total of 7*64 codewords in previous seven frames. Specifically, b_frm=360/7=51.42. In this case, there are three frames in the interleaving source, each of the three frames provides 52 bits for each codeword in an interleaving target, and each of the remaining four frames provides 51 bits for each codeword in the interleaving target. If b_word=360/(7*64)=0.803, 88 codewords in the interleaving source do not provide bits for the codeword in the interleaving target, and each of the remaining 360 codewords provides 1 bit for each codeword in the interleaving target. Therefore, the interleaving solution in this embodiment is an irregular interleaving solution. In the interleaving solution, the interleaving target obtains a same quantity of bits from the 360 codewords, and a difference between quantities of bits obtained by the interleaving target from the frames is also very small, which indicates that the interleaving source is broken up sufficiently in the interleaving manner provided in this solution, thereby effectively improving decoding performance.

In the interleaving solution, 20 image check bits included in each codeword in the interleaving target are divided into seven groups. Because N_ext=ceiling(b_frm)*h−n=ceiling (360/7)*7−360=4, and 0≤i≤6, it may be learned that when i_base(i)=(i+1)*ceiling(b_frm)−i+2; or that when 4≤i≤6, i_base (i)=(i+1)*ceiling(b_frm)−N_ext−1. Therefore, a corresponding value of Col_str is calculated as follows:

i_base([0,1,2,3,4,5,6])[50,101,152,203,255,307,359].

Further, because Range(i)=ceiling((p−i)/h), 0≤i≤h−1, and Range=Range ROR N_ext, Range([0, 1, 2, 3, 4, 5, 6])[3, 3, 3, 2, 3, 3, 3]. Therefore, a set of column coordinates of the 20 image check bits included in each codeword in the interleaving target is Col_str_vec={[48, 49, 50], [99, 100, 101], [150, 151, 152], [202, 203], [253, 254, 255], [305, 306, 307], [357, 358, 359]}. It should be noted that in this embodiment of this application, sets of column coordinates of image check bits in the codewords in the interleaving target are the same.

Figure 22:
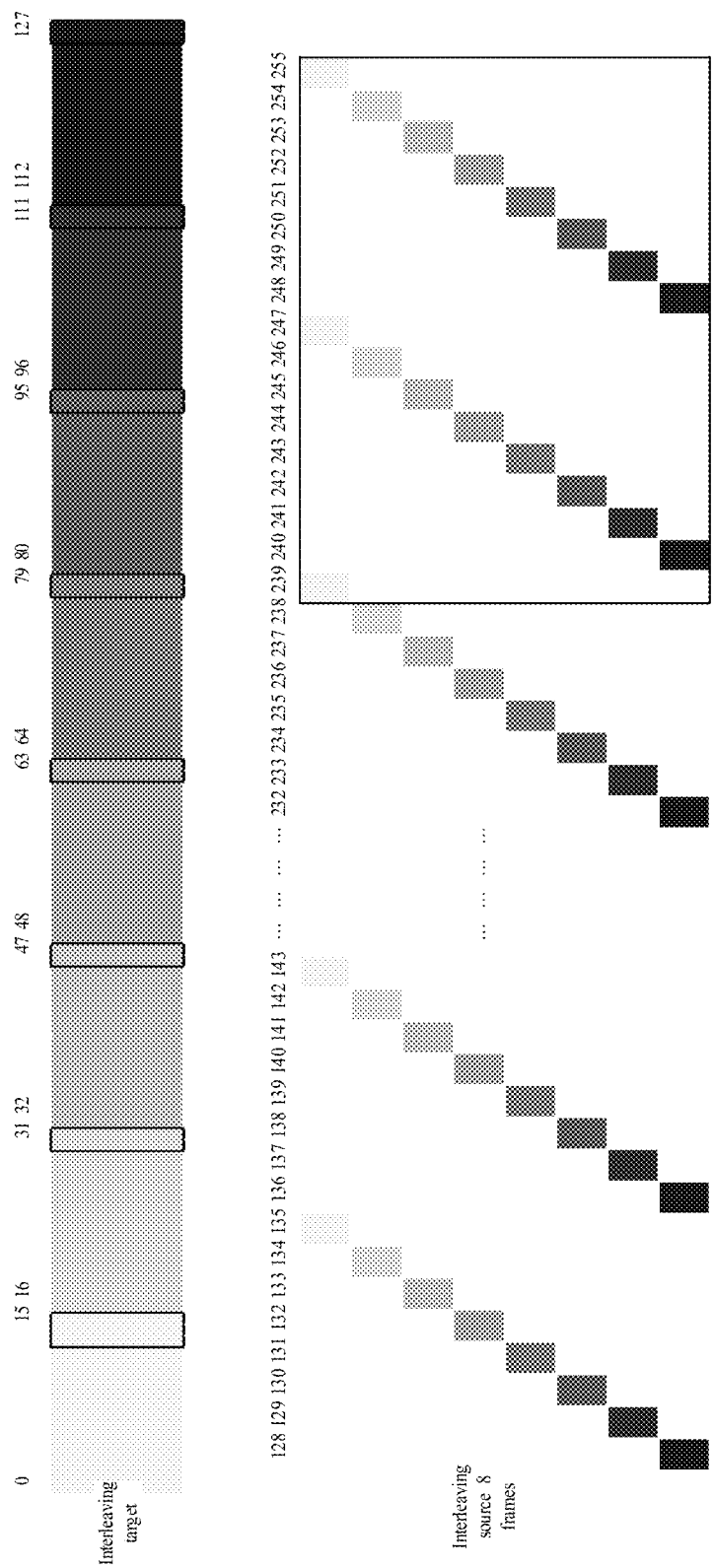
FIG. 22 is a schematic diagram of a specific interleaving solution for an FEC frame according to another embodiment of this application.

Another embodiment of this application further provides an interleaving solution for an FEC frame. A schematic diagram of the interleaving solution is shown in FIG. 22. A quantity of frames included in an interleaving source is h=8, a quantity of codewords included in each frame is p_word=16, and a code included in the FEC frame is an extended BCH (256, 239) code. A corresponding interleaving and mapping function Φ( ) may be expressed as follows:

Φf([Frame,Row_str,Col_str])=Frame−1−frm_map
(floor((Col_str)/16));

Φr([Frame,Row_str,Col_str])=(Col_str⊗Row_str)
%16; and

Φc([Frame,Row_str,Col_str])=128+8*((Col_str)
%16)+(7−floor((Col_str)/16)), where frm_map(i)=7−i, and i∈[0, 7].

In the interleaving solution, 128 image bits in each codeword are from a total of 8*16 codewords in previous eight frames. In addition, b_frm=128/8=16, to be specific, each frame in the interleaving source provides 16 bits for each codeword in an interleaving target; and b_word=128/(8*16)=1, to be specific, each codeword in the interleaving source provides 1 bit for each codeword in the interleaving target. Therefore, the interleaving solution in this embodiment is a complete regular interleaving solution. In the interleaving solution, the interleaving target obtains a same quantity of bits from the codewords in the interleaving source, and also obtains a same quantity of bits from the frames, which indicates that the interleaving source is broken up sufficiently in the interleaving manner provided in this solution, thereby effectively improving decoding performance.

In the interleaving solution, 17 image check bits included in each codeword in the interleaving target are divided into eight groups. Because N_ext=ceiling(b_frm)*h−n=ceiling (128/8)*8−128=0, and it may be learned that i_base(i)=(i+1)*ceiling(b_frm)−N_ext−1. Therefore, a corresponding value of Col_str is calculated as follows:

i_base([0,1,2,3,4,5,6,7])[15,31,47,63,79,95,111,127].

Further, because Range(i)=ceiling((p−i)/h) and Range=Range ROR N_ext, Range([0, 1, 2, 3, 4, 5, 6, 7])=[3, 2, 2, 2, 2, 2, 2, 2]. Therefore, a set of column coordinates of the 17 image check bits included in each codeword in the interleaving target is Col_str_vec={[13, 14, 15], [30, 31], [46, 47], [62, 63], [78, 79], [94, 95], [110, 111], [126, 127]}. It should be noted that in this embodiment of this application, sets of column coordinates of image check bits in the codewords in the interleaving target are the same.

Figure 23:
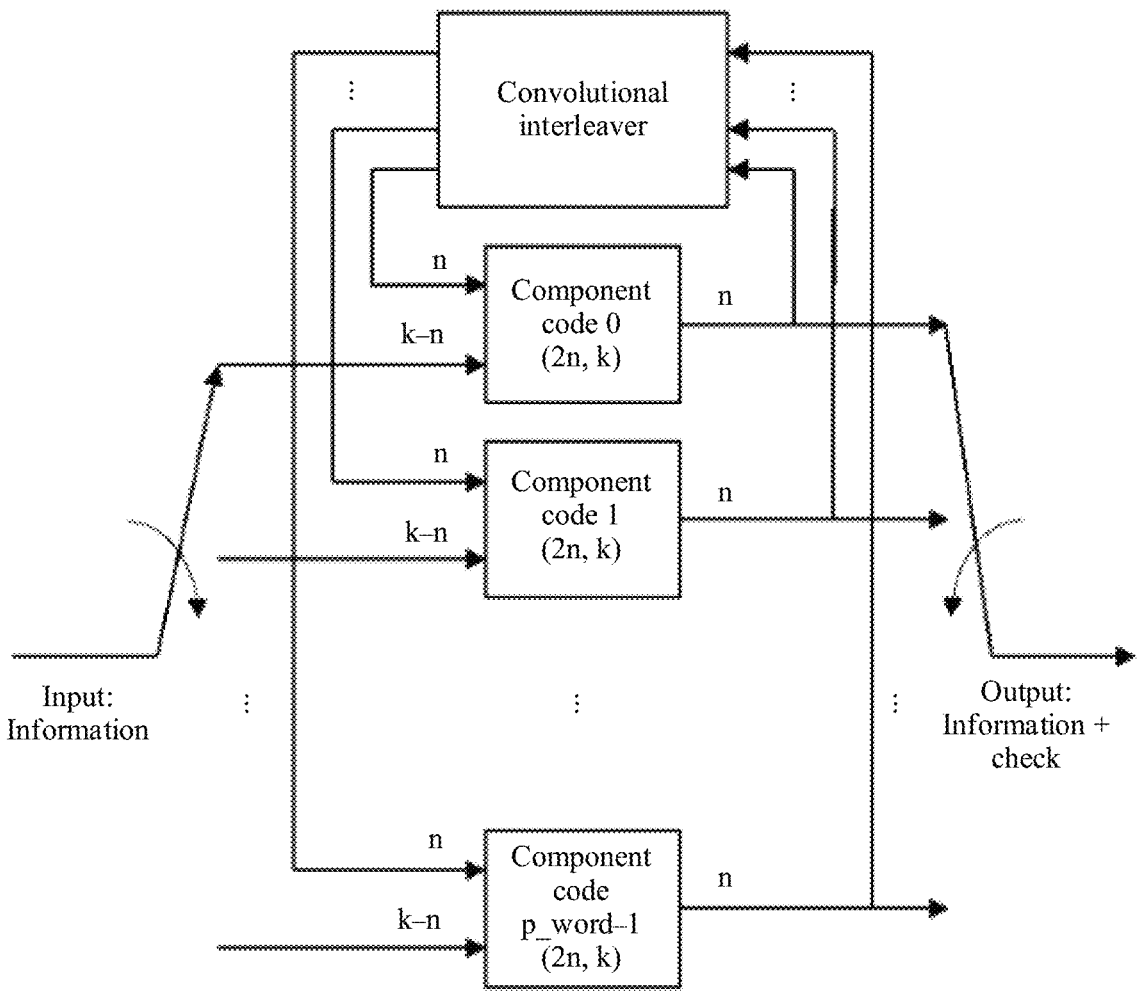
FIG. 23 is a diagram of a coding architecture of an FEC frame according to another embodiment of this application.

Further, the FEC frame described in the foregoing embodiment may be a spatially coupled code and has a coding architecture shown in FIG. 23. In this block diagram, there are p_word component code coders and one convolutional interleaver in total. The convolutional interleaver stores information bits and check bits in h frames before a current moment, and stores h*n*p_word bits in total, which are used to generate n*p_word image bits at the current moment.

Input of a coder is (k−n)*p_word information bits, which are allocated to the p_word component code coders. Input of each component code coder is (k−n) information bits and n image bits, and output is (k−n) information bits and p check bits. Output of the entire coder is a total of (k−n+p)

*p_word=n*p_word information bits and check bits from the p_word component code coders. The image bit from the convolutional interleaver only participates in coding a component code and is not transmitted. It should be understood that h, n, and p_word have same meanings as those in the foregoing embodiment. Details are not described again in this embodiment.

Figure 24:
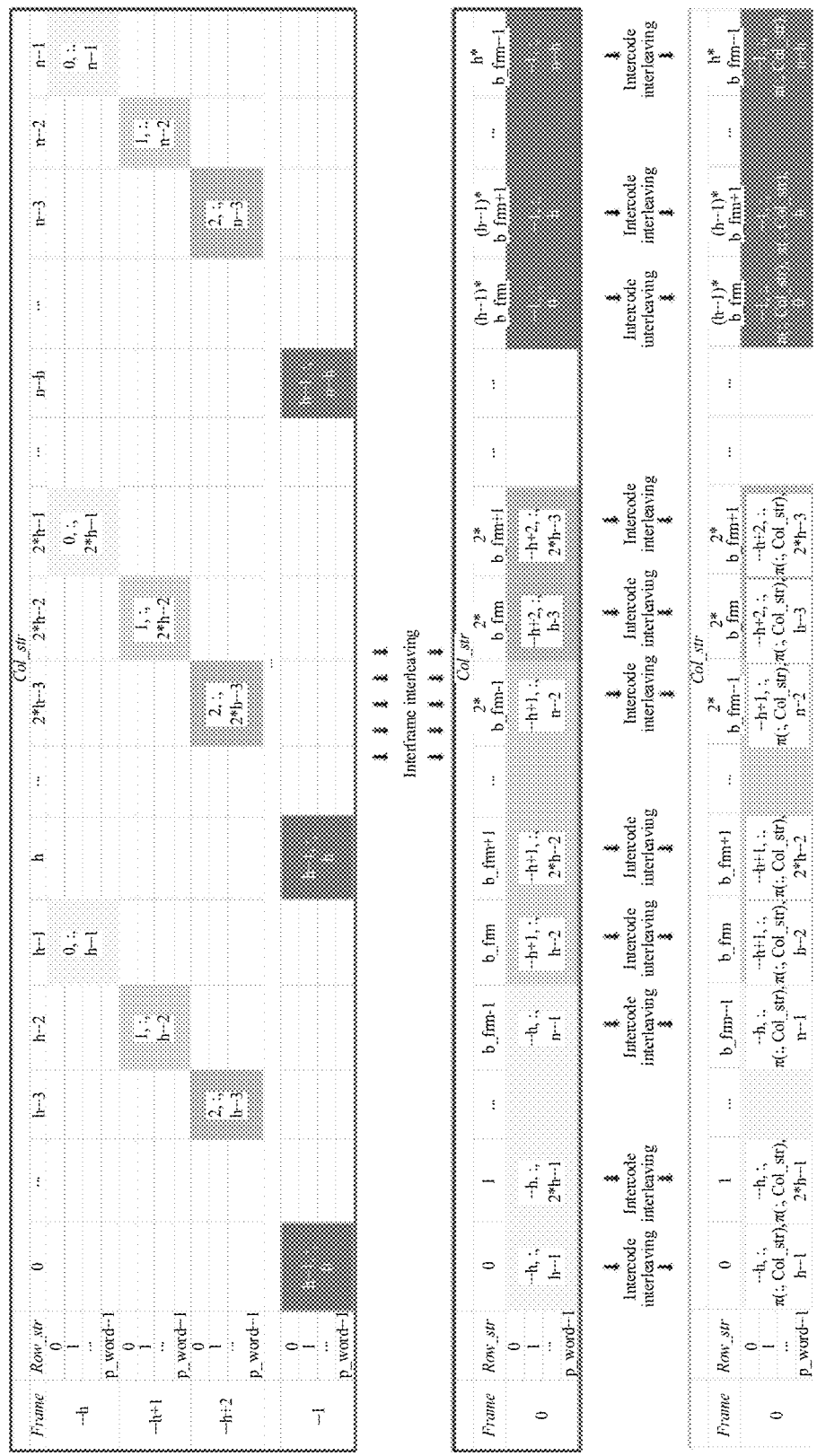
FIG. 24 is a schematic diagram of generating an image bit in a current frame by using the coding architecture shown in FIG. 23.

FIG. 24 shows a method for generating an image bit in a current frame by using the coding architecture shown in FIG. 23. The upper half of FIG. 24 is a matrix of h*p_word rows and n columns. In the matrix, consecutive p_word rows represent a frame shown in FIG. 17(b). Therefore, the convolutional interleaver stores a total of h frames (a frame −h to a frame −1) at the current moment. The image bit in the current frame (a frame 0) is obtained by interleaving bits in the interleaver. For ease of representation, a coordinate of a specific bit is denoted as [Frame, Row_str, Col_str]. The frame coordinate Frame∈(−∞, +∞), the row coordinate Row_str∈[0, p_word−1], and the column coordinate Col_str∈[0, n−1].

An interleaving relationship in the convolutional interleaver is divided into two layers: interframe interleaving and intercode interleaving. Assuming that a coordinate of an interleaved image bit is [Frame', Row_str', Col_str'], the convolutional interleaver describes a relationship of interleaving and mapping from [Frame, Row_str, Col_str] to [Frame', Row_str', Col_str']. A specific solution for each layer of interleaving is described below.

Interframe interleaving: For ease of description, p_word bits in the interleaver that have a same frame coordinate and a same column coordinate are referred to as a symbol and expressed as {[Frame, :, Col_str]}={[Frame, 0, Col_str], [Frame, 1, Col_str], . . . , [Frame, p_word−1, Col_str]}. As shown in FIG. 24, a symbol corresponding to the image bit in the current frame (the frame 0) corresponds to a symbol in the interleaver, and a corresponding coordinate relationship is shown as follows:

Frame'=Frame+1+frm_map(Col_str % h); and

Col_str'=(h−1−Col_str % h)*ceiling(b_frm)+floor (Col_str/h)−Δ.

The function ceiling( ) and the function floor( ) respectively round input up and down, % represents modulo;

frm_map represents a bijective function whose input field and output field each are {0, 1, . . . , h−1}; and in the interleaving solution in FIG. 24, corresponding frm_map(i)=i, where i∈[0, h−1];

"b_frm=n/h" represents an average quantity of bits obtained by each codeword in the current frame from each frame in the interleaver; and Δ is an adjustment item, where if b_frm is an integer, Δ=0; or if b_frm is not an integer, when Col_str/floor(b_frm)<N_ext, Δ=floor(Col_str/floor(b_frm)); or when Col_str/floor(b_frm)≥N_ext, Δ=N_ext, where N_ext=ceiling(b_frm)*h−n.

It may be learned from the formula that interframe interleaving does not involve transformation of a row coordinate. Therefore, a sequence of bits in each symbol is the same as a sequence of bits in the interleaver.

For each symbol on which interframe interleaving is performed, intercode interleaving is further performed on the symbol, so that bits in a same codeword after interleaving are from different frames as much as possible. A specific intercode mapping relationship is shown as the following row coordination transformation formula:

Row_str'=π(Row_str,Col_str)=Row_str⊗(Col_str'% p_word).

In the formula, ⊗ represents bitwise exclusive OR. It may be learned that there are p_word different solutions for intercode interleaving based on different Col_str.

An input bit and an output bit in the interleaver are in a one-to-one correspondence. For a quantity h of interleaved and associated frames, a quantity p_word of codewords per frame, a code length 2n, and a function frm_map that are determinate, an interleaving manner exists and is uniquely determinate, where h, p_word, and 2n are independent of each other and are not mutually constrained. Therefore, even if p_word and 2n are determined, h can still be adjusted to balance decoding performance and a decoding delay.

Based on the foregoing interleaving solution, if b_frm is an integer, each frame in the interleaver provides b_frm bits for each codeword in the current frame; or if b_frm is not an integer, each of (ceiling(b_frm)−b_frm)*h frames in the interleaver provides floor(b_frm) bits for each codeword in the current frame, and each of the remaining (b_frm−floor (b_frm))*h frames provides ceiling(b_frm) bits for each codeword in the current frame. In addition, the following is defined: "b_word=n/(h*p_word)" represents an average quantity of bits obtained by each codeword in the current frame from each codeword in the interleaver. If b_word is an integer, each codeword in the interleaver provides b_word bits for each codeword in the current frame; or if b_word is not an integer, each of (ceiling(b_word)−b_word)* (h*p_word) codewords included in the interleaver provides floor(b_word) bits for each codeword in the current frame, and each of the remaining (b_word−floor(b_word))* (h*p_word) codewords provides ceiling(b_word) bits for each codeword in the current frame. It may be learned that the current frame basically obtains a same quantity of bits from the codewords and also basically obtains a same quantity of codewords from the frames, which indicates that the bits in the interleaver also can be broken up sufficiently in the interleaving manner provided in this solution, thereby effectively improving decoding performance.

Further, this embodiment of this application further describes a location of an image check bit. For an FEC frame determined by a group of parameters h, p_word, and code length 2n shown in FIG. 24, locations of a total of p*p_word image check bits in the FEC frame are also determinate. For the image check bit, Frame=0 and Row_str∈[0, p_word−1]. All P coordinates Col_str are divided into h groups, and the following mainly defines Col_str corresponding to p image check bits.

First, the following is defined: Each group includes a total of h coordinates i_base, and each coordinate i_base represents a maximum Col_str value of an image check bit from a frame in an image bit. If i<N_ext, i_base(i)=(i+1)*ceiling (b_frm)−i−2; or if i≥N_ext, i_base(i)=(i+1)*ceiling(b_frm)−N_ext−1, where 0≤i≤h−1.

Next, the following array is defined to represent a quantity of coordinates corresponding to each i_base: Range(i)=ceiling((p−i)/h), and Range=Range ROR N_ext, where ROR is cyclic right shifting of the array. In this case, a set including all coordinates Col_str is Col_str_vec(i, :)=[i_base(i)— Range(i)+1:i_base(i)].

It should be noted that, to distinguish between different types of interleaving solutions, the following definition is provided: If b_word is an integer, an association relationship is a regular pattern, and the interleaving solution is defined as a complete regular interleaving solution; if b_word is not an integer but b_frm is an integer, the interleaving solution is defined as a partial regular interleaving solution; or if neither b_word nor b_frm is an integer, the interleaving solution is defined as an irregular interleaving solution.

Different types of interleaving solutions are specifically described below based on the coding architecture shown in FIG. 23.

This instance describes a spatially coupled code for which h=5, p_word=64, and a component code is a BCH (720, 700). The component code BCH (720, 700) is a shortened BCH code obtained by shortening a BCH (1023, 1003) code in a Galois field GF (2^10) by 303 bits, and a quantity of error correction bits in the BCH code is t=2.

In a coding architecture of the spatially coupled code in this instance, there are 64 component code coders and one convolutional interleaver in total. The convolutional interleaver stores information bits and check bits in five frames before a current moment, and stores a total of 115200 bits, which are used to generate 23040 image bits at the current moment.

Input of a coder is 21760 information bits, which are allocated to the 64 component code coders. Input of each component code coder is 340 information bits and 360 image bits, and output is 340 information bits and 20 check bits. Total output of the coder is a total of 23040 information bits and check bits from the 64 component code coders. The image bit from the convolutional interleaver only participates in coding a component code and is not transmitted.

Figure 25:
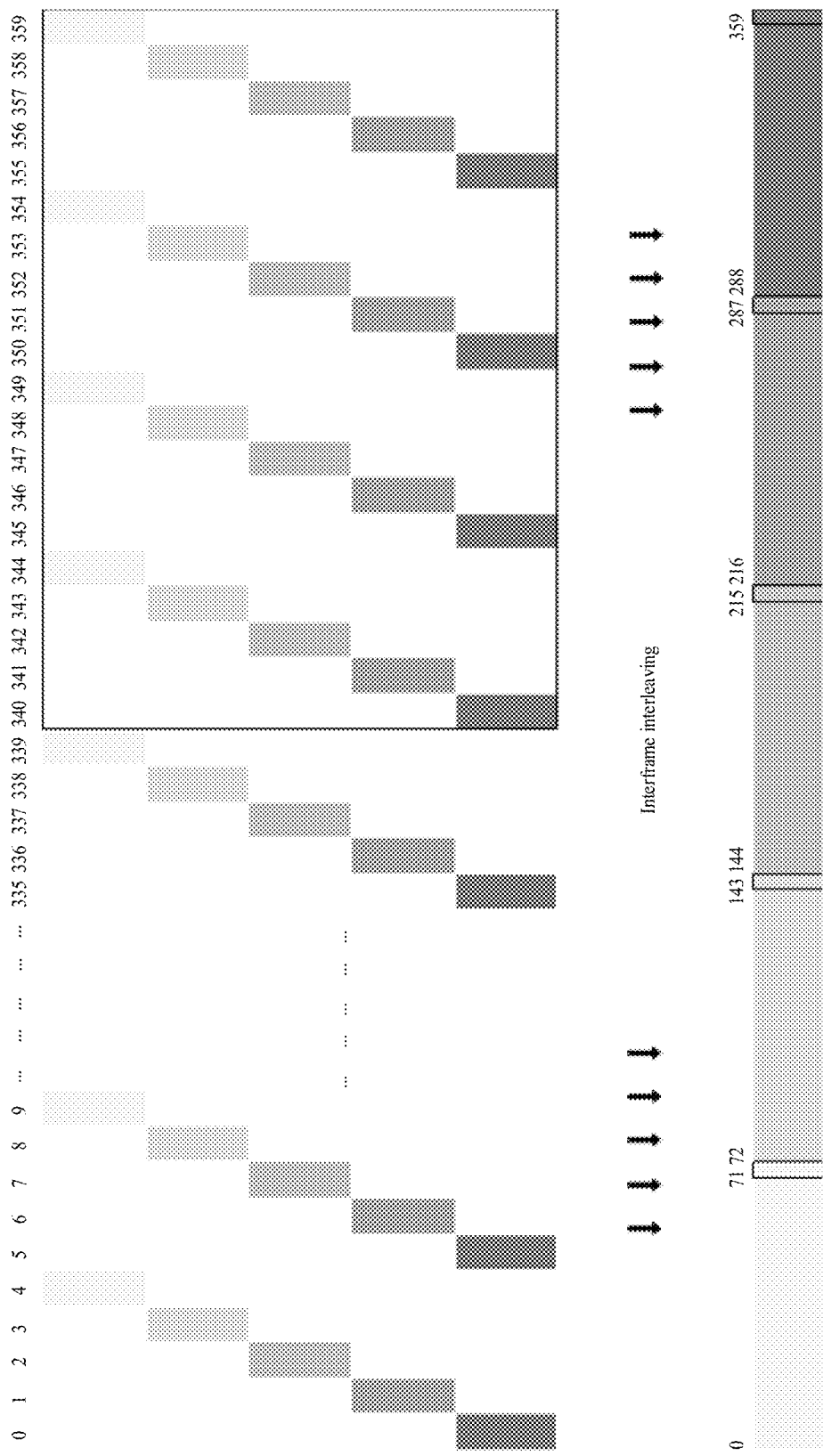
FIG. 25 is a schematic diagram of a specific interleaving solution for an FEC frame according to another embodiment of this application.

As shown in FIG. 25, a symbol corresponding to the image bit in the current frame corresponds to a symbol in the interleaver, and a corresponding coordinate relationship is shown as follows:

Frame'=Frame+1+frm_map(Col_str %5);

Col_str'=(4−Col_str %5)*72+floor(Col_str/5); and frm_map($i$)=$i$, where $i \in [0,4]$; $b\_frm$=72; and $\Delta$=0.

According to the foregoing formula, it may be learned of a specific symbol that is in a specific previous frame and from which the symbol corresponding to the image bit in the current frame comes, that is, interframe interleaving is performed. Intercode interleaving is performed below based on the following correspondence, and a specific intercode mapping relationship is shown in the following row coordinate transformation formula:

Row_str'=π(Row_str,Col_str')=Row_str⊗(Col_str'%64).

It should be noted that in the interleaving solution, 360 image bits in each codeword are from a total of 5*64 codewords in previous five frames. Specifically, a quantity of bits obtained from each frame and a quantity of bits obtained from each codeword are the same as those in the embodiment shown in FIG. 20. In addition, a set of column coordinates of 20 Image check bits included in each component code is also the same as that in the embodiment shown in FIG. 20. Details are not described in this embodiment of this application.

This instance describes a spatially coupled code for which h=7, p_word=64, and a component code is a BCH (720, 700). The component code BCH (720, 700) is a shortened BCH code obtained by shortening a BCH (1023, 1003) code in a Galois field GF (2^10) by 303 bits, and a quantity of error correction bits in the BCH code is t=2.

In a coding architecture of the spatially coupled code in this instance, there are 64 component code coders and one convolutional interleaver in total. The convolutional interleaver stores information bits and check bits in seven frames before a current moment, and stores a total of 161280 bits, which are used to generate 23040 image bits at the current moment.

Input of a coder is 21760 information bits, which are allocated to the 64 component code coders. Input of each component code coder is 340 information bits and 360 image bits, and output is 340 information bits and 20 check bits. Total output of the coder is a total of 23040 information bits and check bits from the 64 component code coders. The image bit from the convolutional interleaver only participates in coding a component code and is not transmitted.

Figure 26:
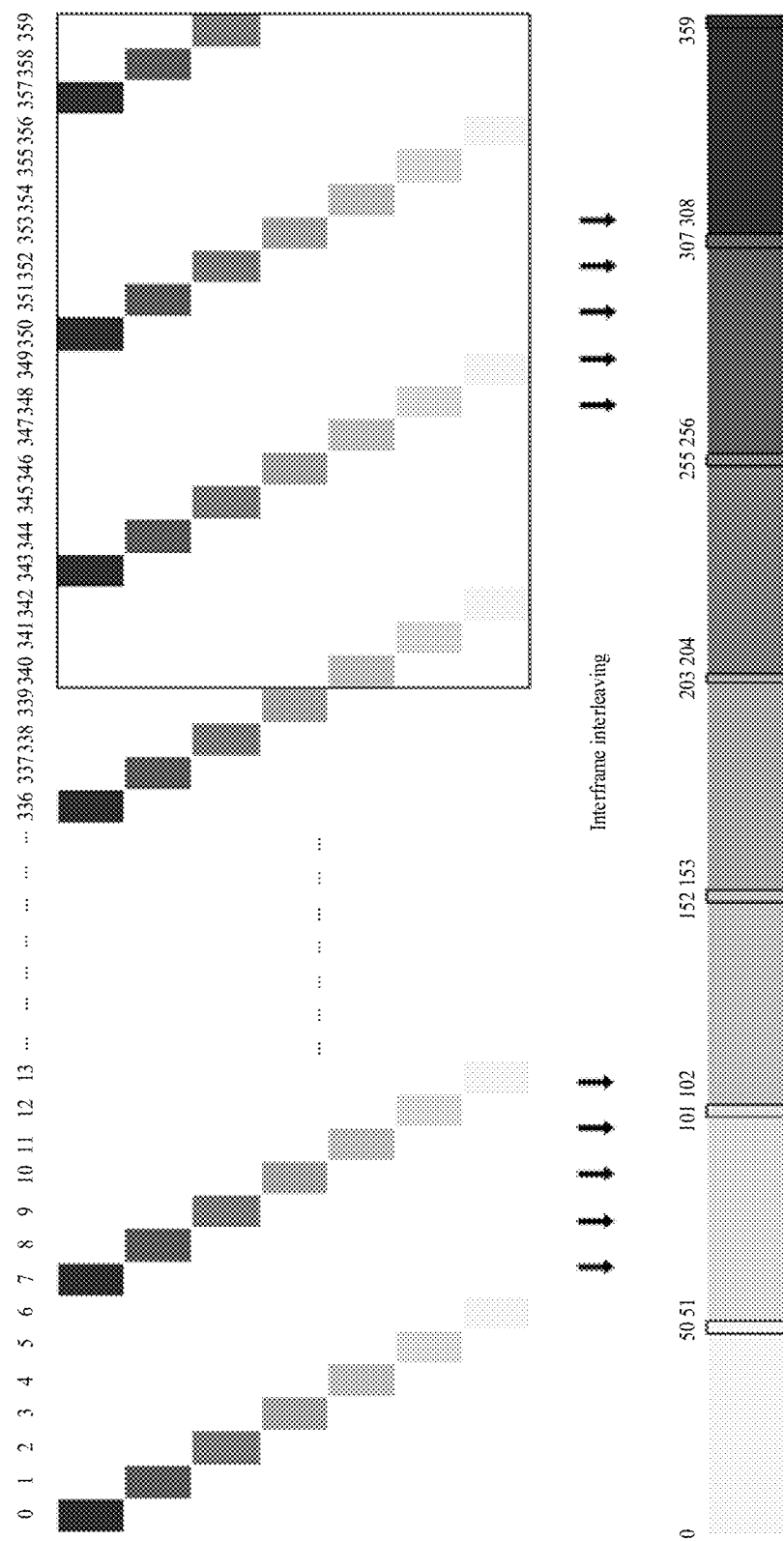
FIG. 26 is a schematic diagram of a specific interleaving solution for an FEC frame according to another embodiment of this application.

As shown in FIG. 26, a symbol corresponding to the image bit in the current frame corresponds to a symbol in the interleaver, and a corresponding coordinate relationship is shown as follows:

Frame'=Frame+1+frm_map(Col_str %7);

Col_str'=(6−Col_str %7)*52+floor(Col_str/7)−$\Delta$; and frm_map($i$)=6−$i$, where $i \in [0,6]$; when Col_str/51<4, $\Delta$=ceiling(Col_str/51); or when Col_str/51≥4, $\Delta$=4; and $b\_frm$=51.42.

According to the foregoing formula, it may be learned of a specific symbol that is in a specific previous frame and from which the symbol corresponding to the image bit in the current frame comes, that is, interframe interleaving is performed. Intercode interleaving is performed below based on the following correspondence, and a specific intercode mapping relationship is shown in the following row coordinate transformation formula:

Row_str'=π(Row_str,Col_str'=Row_str⊗(Col_str'%64).

It should be noted that in the interleaving solution, 360 image bits in each codeword are from a total of 7*64 codewords in previous seven frames. Specifically, a quantity of bits obtained from each frame and a quantity of bits obtained from each codeword are the same as those in the embodiment shown in FIG. 21. In addition, a set of column coordinates of 20 image check bits included in each component code is also the same as that in the embodiment shown in FIG. 21. Details are not described in this embodiment of this application.

This instance describes a spatially coupled code for which h=8, p_word=16, and a component code is an extended BCH (256, 239). In a coding architecture of the spatially coupled code in this instance, there are 16 component code coders and one convolutional interleaver in total. The convolutional interleaver stores information bits and check bits in eight frames before a current moment, and stores a total of 16384 bits, which are used to generate 2048 image bits at the current moment.

Input of a coder is 1776 information bits, which are allocated to the 16 component code coders. Input of each component code coder is 111 information bits and 128 image bits, and output is 111 information bits and 17 check bits. Total output of the coder is a total of 2048 information bits and check bits from the 16 component code coders. The image bit from the convolutional interleaver only participates in coding a component code and is not transmitted.

Figure 27:
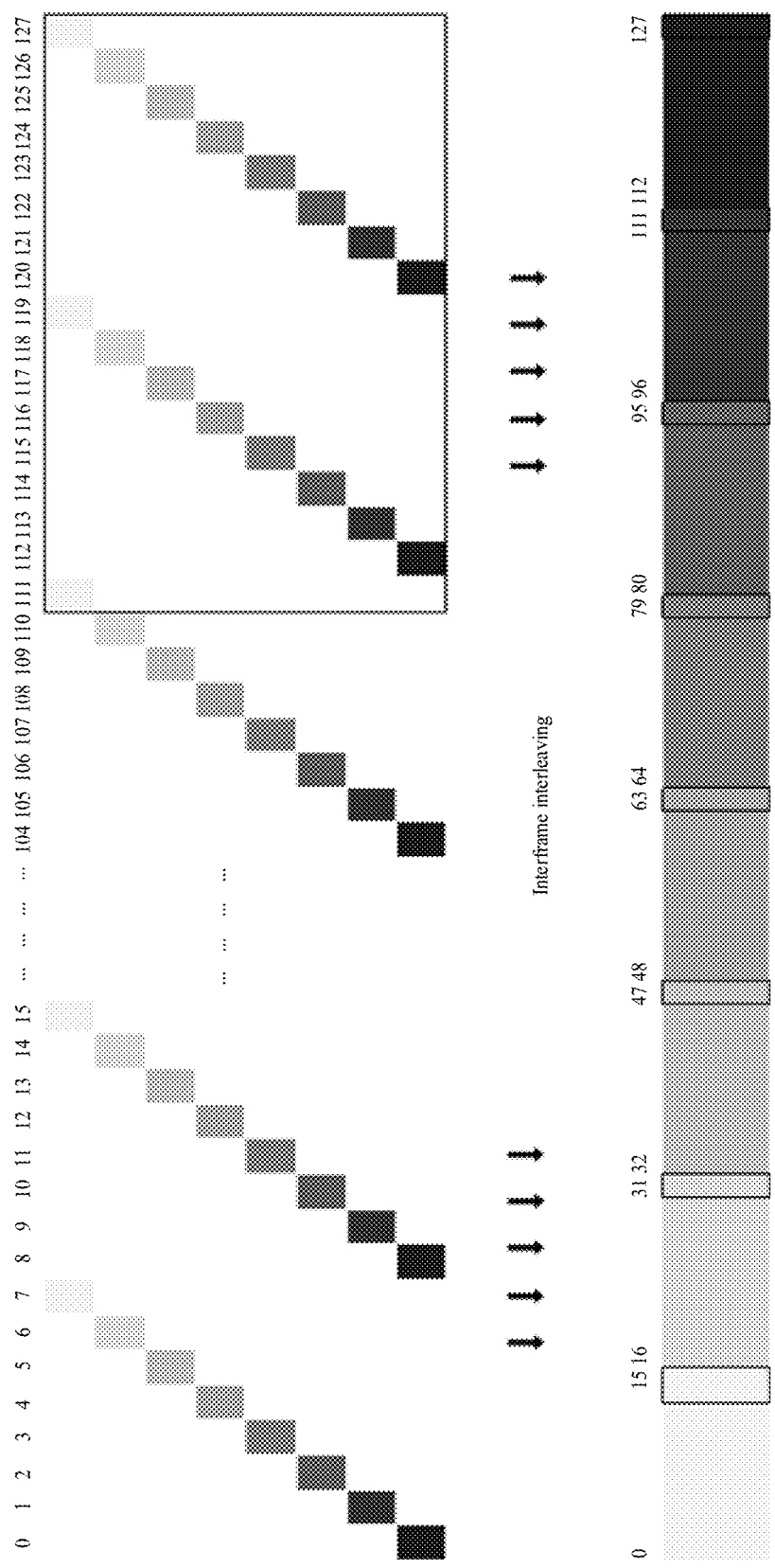
FIG. 27 is a schematic diagram of a specific interleaving solution for an FEC frame according to another embodiment of this application.

As shown in FIG. 27, a symbol corresponding to the image bit in the current frame corresponds to a symbol in the interleaver, and a corresponding coordinate relationship is shown as follows:

Frame'=Frame+1+frm_map(Col_str %8);

Col_str'=(7−Col_str %8)*16+floor(Col_str/8); and frm_map($i$)=$i$, where $i \in [0,7]$; $b\_frm$=16; and $\Delta$=0.

According to the foregoing formula, it may be learned of a specific symbol that is in a specific previous frame and from which the symbol corresponding to the image bit in the current frame comes, that is, interframe interleaving is performed. Intercode interleaving is performed below based on the following correspondence, and a specific intercode mapping relationship is shown in the following row coordinate transformation formula:

$$\text{Row\_str}' = \pi(\text{Row\_str}, \text{Col\_str}') = \text{Row\_str} \otimes (\text{Col\_str}'\%16).$$

It should be noted that in the interleaving solution, 360 image bits in each codeword are from a total of 8*64 codewords in previous eight frames. Specifically, a quantity of bits obtained from each frame and a quantity of bits obtained from each codeword are the same as those in the embodiment shown in FIG. 22. In addition, a set of column coordinates of 20 image check bits included in each component code is also the same as that in the embodiment shown in FIG. 22. Details are not described in this embodiment of this application.

Further, for the codeword in this application, the code length 2n is less than or equal to 2048, the quantity t of error correction bits in the component code BCH is less than or equal to 5, and the quantity h of frames included in the interleaving source is greater than 1. In this case, a constructed codeword can still have relatively good performance when ensuring a low delay. It should be understood that h FEC frames formed before a current moment that are mentioned herein may be h FEC frames at any previous moment. For example, the h FEC frames are FEC frames at h consecutive moments before the current moment, may be h FEC frames that are continuously obtained after an interval of a specific fixed moment from the current moment, or may be FEC frames at any h inconsecutive moments before the current moment. This is not limited in this application.

Moreover, in addition to the embodiments mentioned above, this application may further include the following cases:

A code length is 2n=720, a quantity of error correction bits is t=2, and a quantity of interleaved and associated frames is h=4;

a code length is 2n=720, a quantity of error correction bits is t=2, and a quantity of interleaved and associated frames is h=5;

a code length is 2n=804, a quantity of error correction bits is t=2, and a quantity of interleaved and associated frames is h=4;

a code length is 2n=1206, a quantity of error correction bits is t=3, and a quantity of interleaved and associated frames is h=4;

a code length is 2n=868, a quantity of error correction bits is t=2, and a quantity of interleaved and associated frames is h=4; or a code length is 2n=1302, a quantity of error correction bits is t=3, and a quantity of interleaved and associated frames is h=4.

Each of the foregoing constructed codewords can still have relatively good performance while ensuring a low delay. In addition, a plurality of different interleaving solutions are provided in the foregoing plurality of embodiments, and any coding manner that meets the foregoing interleaving solution or has a formula the same as that provided in the foregoing interleaving solution, or any equivalent or simple variation made based on the formula provided in the foregoing interleaving solution falls within the protection scope of this application.

It should be understood that "one embodiment" or "an embodiment" mentioned throughout this specification means that particular features, structures, or characteristics related to the embodiment are included in at least one embodiment of the present invention. Therefore, "in one embodiment" or "in an embodiment" appearing throughout the specification does not necessarily refer to a same embodiment. In addition, these particular features, structures, or characteristics may be combined in one or more embodiments by using any appropriate manner. Sequence numbers of the foregoing processes do not mean execution sequences in embodiments of the present invention. The execution sequences of the processes should be determined based on functions and internal logic of the processes, and should not be construed as any limitation to the implementation processes of the embodiments of the present invention.

In the several embodiments provided in this application, it should be understood that the disclosed apparatus and method may be implemented in other manners. For example, the described apparatus embodiment is merely an example. For example, division into the units is merely logical function division and may be other division during actual implementation. For example, a plurality of units or components may be combined or integrated into another system, or some features may be ignored or not performed. In addition, the displayed or discussed mutual couplings or direct couplings or communication connections may be implemented through some interfaces, and indirect couplings or communication connections between apparatuses or units may be implemented in an electrical form or another form.

In addition, functional units in the embodiments of the present invention may be integrated into one processing unit, or each of the units may exist alone physically, or two or more units are integrated into one unit.

In summary, what is described above is merely example embodiments of the technical solutions of the present invention, but is not intended to limit the protection scope of the present invention. Any modification, equivalent replacement, or improvement made within the spirit and principle of the present invention shall fall within the protection scope of the present invention.

What is claimed is:

1. A coding method for data communication, wherein the method comprises:
    forming, by a coder, m source codewords;
    forming, by the coder, a first codeword based on the m source codewords, wherein the first codeword comprises n image bits and n to-be-transmitted bits, the n image bits are selected from the m source codewords formed before the first codeword, both n and m are positive integers, and n>m; and
    sending, by an interface, the n to-be-transmitted bits in the first codeword without sending the n image bits in the first codeword.

2. The coding method according to claim 1, wherein the n to-be-transmitted bits comprise p check bits and (n-p) information bits, and the p check bits are obtained by coding the n image bits and the (n-p) information bits, wherein p is a positive integer less than n.

3. The coding method according to claim 2, wherein the n image bits comprise at least one image check bit and at least one image information bit, the at least one image check bit is selected from check bits in the m source codewords, and the at least one image information bit is selected from information bits in the m source codewords.

4. The coding method according to claim 3, wherein a quantity of the at least one image check bits is the same as a quantity of the at least one check bits.

5. The coding method according to claim 1, wherein a maximum value of a difference between quantities of bits provided by different source codewords in the m source codewords to the first codeword is greater than 1 bit.

6. The coding method according to claim 1, wherein a code length of the first codeword is not greater than 2048, and a quantity of error correction bits is not greater than 5.

7. The coding method according to claim 1, wherein in the m source codewords, a quantity of bits provided by at least one source codeword to the first codeword is different from a quantity of bits provided by another source codeword to the first codeword; or
   each source codeword provides q bits to the first codeword, wherein q is an integer greater than 1, and n is an integer multiple of m.

8. The coding method according to claim 1, wherein p_word first codewords constitute a first frame, and image bits in the p_word first codewords in the first frame are from to-be-transmitted bits in codewords in h second frames generated before the first frame, wherein both h and p_word are positive integers greater than 1.

9. The coding method according to claim 8, wherein frame coordinates, row coordinates, and column coordinates of bits in the h second frames are obtained through calculation by using three functions: $\Phi f(\ )\ \Phi r(\ )$, and $\Phi c(\ )$:

$$\Phi f([Frame, Row\_str, Col\_str]) = Frame - 1 - frm\_map\ (floor((Col\_str+\Delta)/ceiling(n/h)));$$

$$\Phi r([Frame, Row\_str, Col\_str]) = (Col\_str \otimes Row\_str)\%\ p\_word;\ and$$

$$\Phi c([Frame, Row\_str, Col\_str]) = n + h*((Col\_str+\Delta)\%\ ceiling(n/h)) + (h-1-floor((Col\_str+\Delta)/ceiling(n/h))),$$

wherein Frame is a frame coordinate, Row_str is a row coordinate, and Col_str is a column coordinate of an image bit in a codeword in the first frame, and Frame, Row_str, and Col_str are all integers, wherein Frame$\in$ $(-\infty, +\infty)$, Row_str$\in$[0, p_word−1], Col_str$\in$[0, 2n−1], frm_map (i)=h−1−i, and i$\in$[0, h−1]; and
if n/h is an integer, $\Delta$=0;
if Col_str/floor (n/h)<ceiling (n/h) *h−n, $\Delta$=floor (Col_str/floor (n/h)); or
if Col_str/floor (n/h) ceiling (n/h) *h−n, $\Delta$= ceiling (n/h) *h−n.

10. The coding method according to claim 9, wherein a set of column coordinates of image check bits in the p_word first codewords in the first frame is shown as follows:

$$Col\_str\_vec(i,:)=[i\_base(i)-Range(i)+1:i\_base(i)],$$
wherein 0 i h−1; and if i<ceiling(n/h)*h−n, i_base(i)=(i+1)*ceiling(n/h)−i−2; or if i>=ceiling(n/h)*h−n, i_base(i)=(i+1)*ceiling(n/h)−ceiling(n/h)*h−n−1; and Range(i)=ceiling((p−i)/h)ROR (ceiling(n/h)*h−n), where ROR is cyclic right shifting of an array.

11. A coding apparatus for data communication, wherein the coding apparatus comprises a coder and an interface, and the coder is configured to:
form m source codewords;
form a first codeword based on the m source codewords, wherein the first codeword comprises n image bits and n to-be-transmitted bits, the n image bits are selected from the m source codewords formed before the first codeword, both n and m are positive integers, and n>m; and
the interface is configured to send the n to-be-transmitted bits in the first codeword without sending the n image bits in the first codeword.

12. The coding apparatus according to claim 11, wherein the n to-be-transmitted bits comprise p check bits and (n−p) information bits, and the p check bits are obtained by coding the n image bits and the (n−p) information bits, wherein p is a positive integer less than n.

13. The coding apparatus according to claim 12, wherein the n image bits comprise at least one image check bit and at least one image information bit, the at least one image check bit is selected from check bits in the m source codewords, and the at least one image information bit is selected from information bits in the m source codewords.

14. The coding apparatus according to claim 13, wherein a quantity the at least one image check bits is the same as a quantity of the at least one check bits.

15. The coding apparatus according to claim 11, wherein a maximum value of a difference between quantities of bits provided by different source codewords in the m source codewords to the first codeword is greater than 1 bit.

16. The coding apparatus according to claim 11, wherein a code length of the first codeword is not greater than 2048, and a quantity of error correction bits is not greater than 5.

17. The coding apparatus according to claim 11, wherein in the m source codewords, a quantity of bits provided by at least one source codeword to the first codeword is different from a quantity of bits provided by another source codeword to the first codeword; or
   each source codeword provides q bits to the first codeword, wherein q is an integer greater than 1, and n is an integer multiple of m.

18. The coding apparatus according to claim 11, wherein p_word first codewords constitute a first frame, and image bits in the p_word first codewords in the first frame are from to-be-transmitted bits in codewords in h second frames generated before the first frame, wherein both h and p_word are positive integers greater than 1.

19. The coding apparatus according to claim 18, wherein frame coordinates, row coordinates, and column coordinates of bits in the h second frames are obtained through calculation by using three functions: $\Phi f(\ )\ \Phi r(\ )$, and $\Phi c(\ )$:

$$\Phi f([Frame, Row\_str, Col\_str]) = Frame - 1 - frm\_map\ (floor((Col\_str+\Delta)/ceiling(n/h)));$$

$$\Phi r([Frame, Row\_str, Col\_str]) = (Col\_str \otimes Row\_str)\%\ p\_word;\ and$$

$$\Phi c([Frame, Row\_str, Col\_str]) = n + h*((Col\_str+\Delta)\%\ ceiling(n/h)) + (h-1-floor((Col\_str+\Delta)/ceiling(n/h))),$$

wherein Frame is a frame coordinate, Row_str is a row coordinate, and Col_str is a column coordinate of an image bit in a codeword in the first frame, and Frame, Row_str, and Col_str are all integers, wherein Frame$\in$ $(-\infty, +\infty)$, Row_str$\in$[0, p_word−1], Col_str$\in$[0, 2n−1], frm_map (i)=h−1−i, and i$\in$[0, h−1]; and
if n/h is an integer, $\Delta$=0;
if Col_str/floor (n/h)<ceiling (n/h) *h−n, $\Delta$=floor (Col_str/floor (n/h)); or
if Col_str/floor (n/h) ceiling (n/h) *h−n, $\Delta$=ceiling (n/h) *h−n.

20. The coding apparatus according to claim 19, wherein a set of column coordinates of image check bits in the p_word first codewords in the first frame is shown as follows:

$$Col\_str\_vec(i,:)=[i\_base(i)-Range(i)+1:i\_base(i)],$$
wherein $0 \leq i \leq h-1$; and if $i<\text{ceiling}(n/h)*h-n$, $i\_base(i)=(i+1)*\text{ceiling}(n/h)-i-2$; or if $i>=\text{ceiling}(n/h)*h-n$, $i\_base(i)=(i+1)*\text{ceiling}(n/h)-\text{ceiling}(n/h)*h-n-1$; and $Range(i)=\text{ceiling}((p-i)/h)\text{ROR}(\text{ceiling}(n/h)*h-n)$, where ROR is cyclic right shifting of an array.

\* \* \* \* \*

UNITED STATES PATENT AND TRADEMARK OFFICE
CERTIFICATE OF CORRECTION

PATENT NO. : 12,206,494 B2
APPLICATION NO. : 17/954160
DATED : January 21, 2025
INVENTOR(S) : Huixiao Ma et al.

Page 1 of 1

It is certified that error appears in the above-identified patent and that said Letters Patent is hereby corrected as shown below:

On the Title Page

In Column 2 item (57) (Abstract), In Line 9, Delete "n>m;" and insert -- n>m. --.

In the Claims

In Column 37, In Line 28, In Claim 9, delete "Φf( )" and insert -- Φf( ), --.

In Column 38, In Line 20 (Approx.), In Claim 14, after "quantity" insert -- of --.

In Column 38, In Line 45 (Approx.), In Claim 19, delete "Φf( )" and insert -- Φf(), --.

In Column 39, In Line 12, In Claim 20, delete "where" and insert -- wherein --.

Signed and Sealed this
Twenty-second Day of April, 2025

Coke Morgan Stewart
*Acting Director of the United States Patent and Trademark Office*